US008227359B2

(12) United States Patent
Yokoyama et al.

(10) Patent No.: US 8,227,359 B2
(45) Date of Patent: *Jul. 24, 2012

(54) METHOD FOR MANUFACTURING GROUP III NITRIDE SEMICONDUCTOR LAYER, METHOD FOR MANUFACTURING GROUP III NITRIDE SEMICONDUCTOR LIGHT-EMITTING DEVICE, AND GROUP III NITRIDE SEMICONDUCTOR LIGHT-EMITTING DEVICE, AND LAMP

(75) Inventors: Yasunori Yokoyama, Ichihara (JP); Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/205,569

(22) Filed: Aug. 8, 2011

(65) Prior Publication Data
US 2011/0284919 A1    Nov. 24, 2011

Related U.S. Application Data

(63) Continuation of application No. 12/922,135, filed as application No. PCT/JP2009/054436 on Mar. 9, 2009, now Pat. No. 8,080,484.

(30) Foreign Application Priority Data

Mar. 12, 2008  (JP) ................................ 2008-062597

(51) Int. Cl.
*H01L 21/00* (2006.01)
*H01L 21/324* (2006.01)
*H01L 21/477* (2006.01)
(52) U.S. Cl. .............. 438/798; 438/46; 438/47; 438/93; 438/94; 438/795; 257/E21.002; 257/E21.127; 257/E21.441; 257/E21.459

(58) Field of Classification Search ........... 257/E21.002, 257/E21.127, E21.311, E21.441, E21.449, 257/E21.451, E21.459
See application file for complete search history.

(56) References Cited

U.S. PATENT DOCUMENTS

| 5,683,548 | A | 11/1997 | Hartig et al. |
| 6,362,496 | B1 * | 3/2002 | Nanishi et al. .................. 257/94 |
| 6,768,079 | B2 | 7/2004 | Kosakai |
| 2003/0085206 | A1 | 5/2003 | Kosakai |
| 2008/0057740 | A1 | 3/2008 | Munro et al. |

(Continued)

FOREIGN PATENT DOCUMENTS

JP    60-039819 A    3/1985

(Continued)

OTHER PUBLICATIONS

Pamphlet of "The 66th autumn meeting of the Japan Society of Applied Physics", edited by the Japan Society of Applied Physics, 2005, p. 249, 7a-N-6.

(Continued)

*Primary Examiner* — Mohsen Ahmadi
(74) *Attorney, Agent, or Firm* — Sughrue Mion, PLLC

(57) ABSTRACT

A method for manufacturing a Group III nitride semiconductor layer according to the present invention includes a sputtering step of disposing a substrate and a target containing a Group III element in a chamber, introducing a gas for formation of a plasma in the chamber and forming a Group III nitride semiconductor layer added with Si as a dopant on the substrate by a reactive sputtering method, wherein a Si hydride is added in the gas for formation of a plasma.

1 Claim, 9 Drawing Sheets

U.S. PATENT DOCUMENTS

| | | |
|---|---|---|
| 2008/0303054 A1 | 12/2008 | Yokoyama et al. |
| 2009/0087936 A1* | 4/2009 | Miki et al. ............... 438/46 |
| 2009/0135875 A1* | 5/2009 | Ueda et al. ............ 372/45.012 |
| 2009/0142870 A1 | 6/2009 | Miki et al. |
| 2009/0194784 A1 | 8/2009 | Kaji et al. |
| 2009/0315046 A1 | 12/2009 | Miki et al. |
| 2010/0301379 A1 | 12/2010 | Yokoyama et al. |

FOREIGN PATENT DOCUMENTS

| | | |
|---|---|---|
| JP | 08-181073 A | 7/1996 |
| JP | 2008-047763 A | 2/2008 |

OTHER PUBLICATIONS

Y. Ushiku, et al., 21st Seiki Rengo Symposium Ronbunshyu, 2003, pp. 295-298, vol. 2nd.

T. Kikuma, et al.; "GaN films deposited by planar magnetron sputtering", Vacuum, 2002, pp. 233-237, vol. 66.

Pamphlet of "The 66th autumn meeting of the Japan Society of Applied Physics", edited by The Japan Society of Applied Physics, 2005, p. 248, 7a-N-6.

* cited by examiner

METHOD FOR MANUFACTURING GROUP III NITRIDE SEMICONDUCTOR LAYER, METHOD FOR MANUFACTURING GROUP III NITRIDE SEMICONDUCTOR LIGHT-EMITTING DEVICE, AND GROUP III NITRIDE SEMICONDUCTOR LIGHT-EMITTING DEVICE, AND LAMP

CROSS-REFERENCE TO RELATED APPLICATIONS

This is a Rule 53(b) Continuation of application Ser. No. 12/922,135 filed Sep. 10, 2010, which is a 371 of PCT Application No. PCT/JP2009/054436 filed Mar. 9, 2009, and which claims benefit to Japanese Patent Application No. 2008-062597 filed Mar. 12, 2008. The above-noted applications are incorporated herein by reference in their entirety.

TECHNICAL FIELD

The present invention relates to a method for manufacturing a Group III nitride semiconductor layer that is suitable for use in a light-emitting diode (LED), a laser diode (LD), an electronic device, or the like, and particularly to a method for manufacturing a Group III nitride semiconductor layer that is used for formation of a Group III nitride semiconductor layer in which a dopant has been added, a method for manufacturing a Group III nitride semiconductor light-emitting device, and a Group III nitride semiconductor light-emitting device, and a lamp.

BACKGROUND ART

A Group III nitride semiconductor possess a band gap of a direction transition type of energy corresponding to the visible light to the ultraviolet light region, and has an excellent level of light emission efficiency. Therefore, it has been commercialized as semiconductor light-emitting devices such as light-emitting diodes (LED) and laser diodes (LD) and is used in a variety of purposes. Also when the Group III nitride semiconductor is used in an electronic device, it has the potential to achieve superior properties compared to a case where a conventional Group III compound semiconductor is used.

Such a Group III nitride semiconductor is commonly produced by a metal-organic chemical vapor deposition (MOCVD) method using materials such as trimethyl gallium, trimethyl aluminum and ammonia. The MOCVD method is a method in which vapors of materials are contained in a carrier gas and are transported to the substrate surface, and then the materials are decomposed are decomposed by the reaction with the heated substrate, thereby causing crystal growth.

Heretofore, single crystal wafers of the Group III nitride semiconductor have not been commercially available, and the Group III nitride semiconductor is commonly obtained by growing crystals on a single crystal wafer of a different material.

It is also studied to manufacture Group III nitride semiconductor crystals by sputtering. For example, there is proposed a method in which a film of GaN is directly formed on a sapphire ($Al_2O_3$) substrate using a sputtering method for the purpose of laminating high-resistance GaN (for example, refer to Patent Document 1). When the film of GaN is formed by the sputtering method, there are advantages such as low equipment costs and stabilization of steps.

There is also proposed a method in which a GaN layer is formed on the (100) plane of silicon (Si) and the (0001) plane of sapphire ($Al_2O_3$) by high frequency magnetron sputtering using an $N_2$ gas (for example, refer to Non-Patent Document 1).

There is also proposed a method in which a GaN layer is formed using an apparatus including a cathode and a solid target disposed to face with each other, a mesh being interposed between the substrate and the target (for example, refer to Non-Patent Document 2).

When a layer composed of crystals of the Group III nitride compound semiconductor described above is formed, there is required a technique of adding a dopant element such as Si or Mg for the purpose of controlling electric resistance. For example, there is an example of a report about the results of a test of doping in a GaN film using a sputtering method (for example, refer to Non-Patent Document 3). Non-Patent Document 3 does not describe a specific doping method and therefore it is impossible to perform an additional test by third party.

[Patent Document 1]
Japanese Unexamined Patent Application, First Publication No. S60-039819
[Non-Patent Document 1]
Y. USHIKU et al., "$21^{st}$ Seiki Rengo Symposium Ronbunshyu", Vol. 2nd, p. 295 (2003)
[Non-Patent Document 2]
T. Kikuma at al., "Vacuum", Vol. 66, p. 233 (2002)
[Non-Patent Document 3]
Edited by The Japan Society of Applied Physics, Pamphlet of "The 66th autumn meeting of the Japan Society of Applied Physics", 7a-N-6, p. 248, 2005

DISCLOSURE OF INVENTION

Problems to be Solved by the Invention

In the case where a film composed of GaN crystals in which a Si element has been added is formed using a conventional sputtering method as described in Patent Document 1 and Non-Patent Documents 1 to 3 described above, when an Si piece is disposed in the plasma region, together with a gallium (Ga) target, there is a problem that Si is doped in the form of a multimer by a sputtering voltage and an activation rate (carrier concentration to dopant concentration) of Si as a dopant decreases.

The present invention has been made in light of the problems described above and an object thereof is to provide a method for manufacturing a Group III nitride semiconductor layer, that can easily optimize the doping concentration of Si as a dopant element in crystals of a Group III nitride semiconductor layer, and also can efficiently perform film formation using a sputtering method and can increase an activation rate of Si as a dopant element, and a method for manufacturing a Group III nitride semiconductor light-emitting device.

Another object of the present invention is to provide a Group III nitride semiconductor light-emitting device having excellent light emission properties obtained by the manufacturing method described above, and a lamp.

Means to Solve the Problems

The present inventors have intensively studied so as to achieve the objects described above and found that it is possible to exhibit excellent doping efficiency and activation rate by supplying a gas of a Si hydride into a chamber as a doping method other than a method of sputtering a solid Si. As a result of a further intensive study, the present inventors have found that it is possible to control the doping amount of Si with high accuracy by using a sputtering method capable of alternately supplying a plasma capable of supplying Group III material particles and a plasma containing a nitrogen element to a substrate, and adding a Si hydride to either or both of the plasma capable of supplying Group III material particles and the plasma containing a nitrogen element to a substrate. Thus, the present invention has been completed.

The present invention relates to the aspects described below.

[1] A method for manufacturing a Group III nitride semiconductor layer, which includes:

a sputtering step of disposing a substrate and a target containing a Group III element in a chamber, introducing a gas for formation of a plasma in the chamber and forming a Group III nitride semiconductor layer, in which Si has been added as a dopant, on the substrate by a reactive sputtering method, wherein a Si hydride is added in the gas for formation of a plasma.

[2] The method for manufacturing a Group III nitride semiconductor layer according to [1], wherein the sputtering step includes:

a first plasma generation step of adding the Si hydride in a gas for formation of a first plasma, which contains no nitrogen element, introducing the gas in the chamber and sputtering the target, thereby generating a first plasma containing sputtering particles comprised of at least a Group III element, and a second plasma generation step of introducing a gas for formation of a second plasma, which contains at least a nitrogen element, in the chamber and generating a second plasma containing at least the nitrogen element, wherein the Group III nitride semiconductor layer is formed by performing the first plasma generation step and the second plasma generation step repeatedly and alternately.

[3] The method for manufacturing a Group III nitride semiconductor layer according to [1] or [2], wherein the Si hydride is $SiH_4$ or $Si_2H_6$.

[4] The method for manufacturing a Group III nitride semiconductor layer according to any one of [1] to [3], wherein the Group III element constituting the target is Al or Ga.

[5] The method for manufacturing a Group III nitride semiconductor layer according to any one of [1] to [4], wherein the additive amount of Si is controlled by controlling a flow rate of the Si hydride to be added in the gas for formation of a plasma.

[6] A method for manufacturing a Group III nitride semiconductor light-emitting device, which includes:

a lamination step of sequentially laminating a laminated semiconductor layer comprising an n-type semiconductor layer, a light-emitting layer and a p-type semiconductor layer on a substrate, wherein the n-type semiconductor layer is formed by the method according to any one of [1] to [5].

[7] A Group III nitride semiconductor light-emitting device obtained by the method for manufacturing a Group III nitride semiconductor light-emitting device according to [6].

[8] A lamp formed with use of the Group III nitride semiconductor light-emitting device according to [7].

Effect of the Invention

The method for manufacturing a Group III nitride semiconductor layer of the present invention is a method in which Si is supplied to a Group III nitride semiconductor layer by adding a hydride containing Si as a dopant to a gas for formation of a plasma, thereby supplying Si into a chamber when the Group III nitride semiconductor layer in which Si has been added as the dopant is formed by a reactive sputtering method. Therefore, it is possible to easily control the doping amount of Si by adjusting the additive amount of a Si hydride. When the Si hydride is used as a material of a Si element and is decomposed in the plasma, Si is less likely to be converted into the form of a multimer, and thus electric resistance in the Group III nitride layer can be decreased even if the concentration of the dopant is low.

As described above, since the dopant concentration of the Group III nitride semiconductor layer to be formed can be easily controlled, it becomes possible to optimally control electric resistance according to the objective properties and to stably form a Group III nitride semiconductor layer having satisfactory crystallinity on a substrate with high efficiency.

Since the method for manufacturing a Group III nitride semiconductor layer of the present invention is a method in which a Si hydride is added in a gas for formation of a first plasma, which contains no nitrogen element, to be introduced into a chamber in a first plasma generation step of generating a first plasma containing sputtering particles comprised of at least a Group III element, it is possible to efficiently dope Si.

As described above, since the method for manufacturing a Group III nitride semiconductor layer of the present invention can easily control the doping concentration of Si by adjusting the additive amount of the Si hydride and Si is less likely to be converted into the form of a multimer, Si has a high activation rate. Therefore, it is possible to optimally control electric resistance and to form a Group III nitride semiconductor layer having excellent crystallinity.

According to the method for manufacturing a Group III nitride semiconductor light-emitting device of the present invention, since an n-type semiconductor layer is formed by the manufacturing method described above, it is possible to obtain a Group III nitride semiconductor light-emitting device, that includes a Group III nitride semiconductor layer having satisfactory crystallinity with controlled electric resistance and also has excellent light emission properties.

Furthermore, since the Group III nitride semiconductor light-emitting device and the lamp of the present invention are obtained by the method for manufacturing a Group III nitride semiconductor light-emitting device of the present invention, they include a Group III nitride semiconductor layer having satisfactory crystallinity with controlled electric resistance and also have excellent light emission properties.

DESCRIPTION OF THE REFERENCE SYMBOLS

Figure 1:
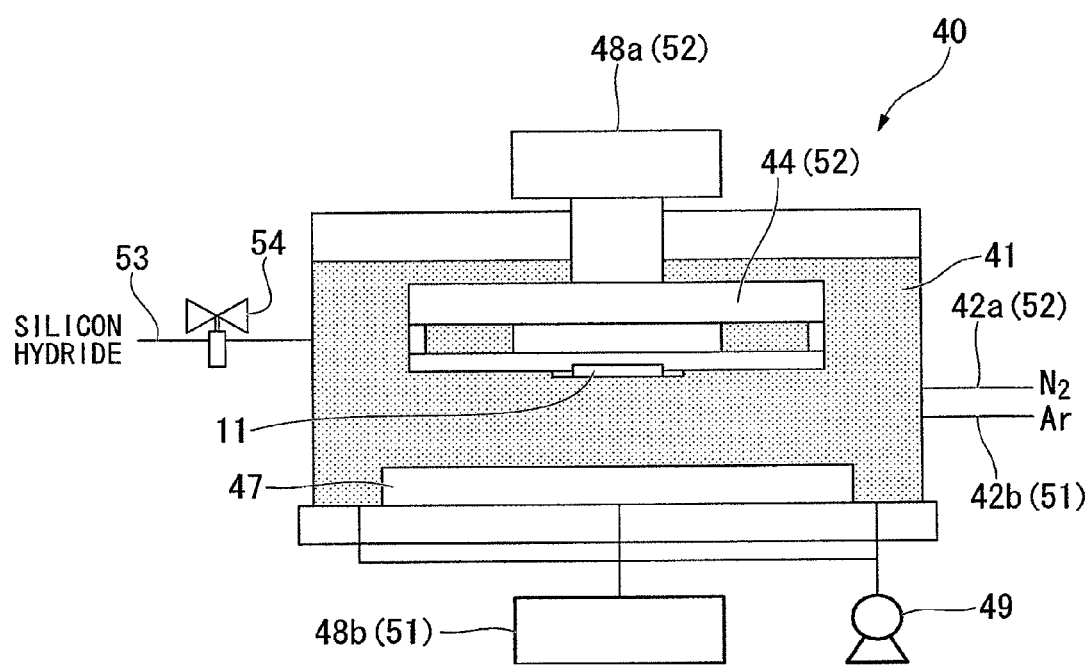
FIG. 1 is a diagram schematically showing a sputtering apparatus as an example of an apparatus for manufacturing a Group III nitride semiconductor layer according to the present invention.

1: Group III nitride semiconductor light-emitting device (Light-emitting device)
3: Lamp
10: Laminated semiconductor
11: Substrate
12: Buffer layer
14: n-type semiconductor layer
15: Light-emitting layer
16: p-type semiconductor layer
17: Translucent positive electrode
40: Sputtering apparatus
41: Chamber
44: Heater
47: Target
48a, 48b: Power supply
51: First plasma generation means
52: Second plasma generation means
53: Si hydride supply means
54: Flow control means

BEST MODE FOR CARRYING OUT THE INVENTION

One embodiment of a method for manufacturing a Group III nitride semiconductor layer according to the present invention, a method for manufacturing a Group III nitride semiconductor light-emitting device, and a Group III nitride semiconductor light-emitting device, and a lamp will be described with reference to the accompanying drawings.

[Method for Manufacturing Group III Nitride Semiconductor Layer]

<Sputtering Apparatus>

FIG. 1 is a diagram schematically showing a sputtering apparatus that can be applied to a method for manufacturing a Group III nitride semiconductor layer according to the present invention. The sputtering apparatus 40 shown in FIG. 1 is an apparatus for forming a Group III nitride semiconductor layer composed of AlInGaN, AlN, GaN or the like. As shown in FIG. 1, the sputtering apparatus 40 includes a chamber 41, a target 47 disposed in the chamber 41, first plasma generation means 51 for generating a first plasma, capable of sputtering the target 47, thereby supplying material particles onto a substrate 11, and second plasma generation means 52 for generating a second plasma containing a nitrogen element.

The sputtering apparatus 40 shown in FIG. 1 also includes control means (not shown) for controlling the first plasma generation means 51 and the second plasma generation means 52. In the sputtering apparatus 40 shown in FIG. 1, a first plasma and a second plasma are alternately generated by controlling the first plasma generation means 51 and the second plasma generation means 52 using the control means to alternately form the first plasma and the second plasma in the chamber 41.

Furthermore, the sputtering apparatus 40 shown in FIG. 1 is provided with Si hydride supply means 53 for supplying a gaseous Si hydride into the chamber 41, and thus the amount of the Si hydride to be supplied into the chamber 41 can be adjusted by the flow control means 54.

The first plasma generation means 51 is provided with a power supply 48b for applying a predetermined power to the target 47, and an argon gas supply means 42b for supplying an argon gas into the chamber 41. The power (applied electric power) to be applied to the target 47 can be adjusted through control by the power supply 48b. The power supply 48b and the argon gas supply means 42b are controlled by control means.

The first plasma generation means 51 preferably forms a thin film having a thickness of 0.2 nm to 2 nm composed of the material constituting the target 47 on the substrate. When the thickness of the film is less than 0.2 nm, it may become impossible to uniformly coat the entire surface of the substrate 11 or the Group III nitride semiconductor layer during growing, resulting in distribution of in-plane crystallinity. In contrast, when the thickness of the film is more than 2 nm, nitridation with the second plasma occurs only on the surface and uniformity in the thickness direction cannot be obtained.

The first plasma generation means 51 may form a thin layer having a one-atomic layer thickness, composed of the material constituting the target 47.

The second plasma generation means 52 is provided with a heater 44 for heating the substrate 11, a power supply 48a connected conductively to the heater 44 and the substrate 11, and nitrogen gas supply means 42a (material gas supply means) for supplying a nitrogen gas into the chamber 41. The power (applied electric power) to be supplied into the heater 44 can be adjusted through control by the power supply 48a. The power supply 48a and the nitrogen gas supply means 42b are controlled by control means (not shown).

The target 47 contains a Group III element such as Ga, Al or the like that constitutes a Group III nitride semiconductor layer to be formed.

The sputtering apparatus 40 shown in FIG. 1 is provided with pressure control means 49 such as a pump, and thus a pressure in the chamber 41 can be controlled to a predetermined pressure.

In the present embodiment, the power (applied electric power) to be supplied by power supplies 48a, 48b is applied by a pulsed DC method or an RF (high frequency) system. In a state where the electric field is continuously applied to the target 47 by a DC system, when the target surface deteriorates, the target 47 is charged up, resulting in unstable discharge. Therefore, it is preferred to use a pulsed DC method capable of pulsingly applying a power.

<Manufacturing Method (1)>

As shown in FIG. 1, the method for manufacturing a Group III nitride semiconductor layer of the present embodiment is a method of disposing a substrate 11 and a target 47 containing a Ga element in a chamber 41 and forming a Group III nitride semiconductor layer, in which Si has been added as a dopant, on the substrate 11 by a reactive sputtering method, wherein Si as the dopant is added to the Group III nitride semiconductor layer by supplying a Si hydride from Si hydride supply means 53 into the chamber 41.

Figure 4:
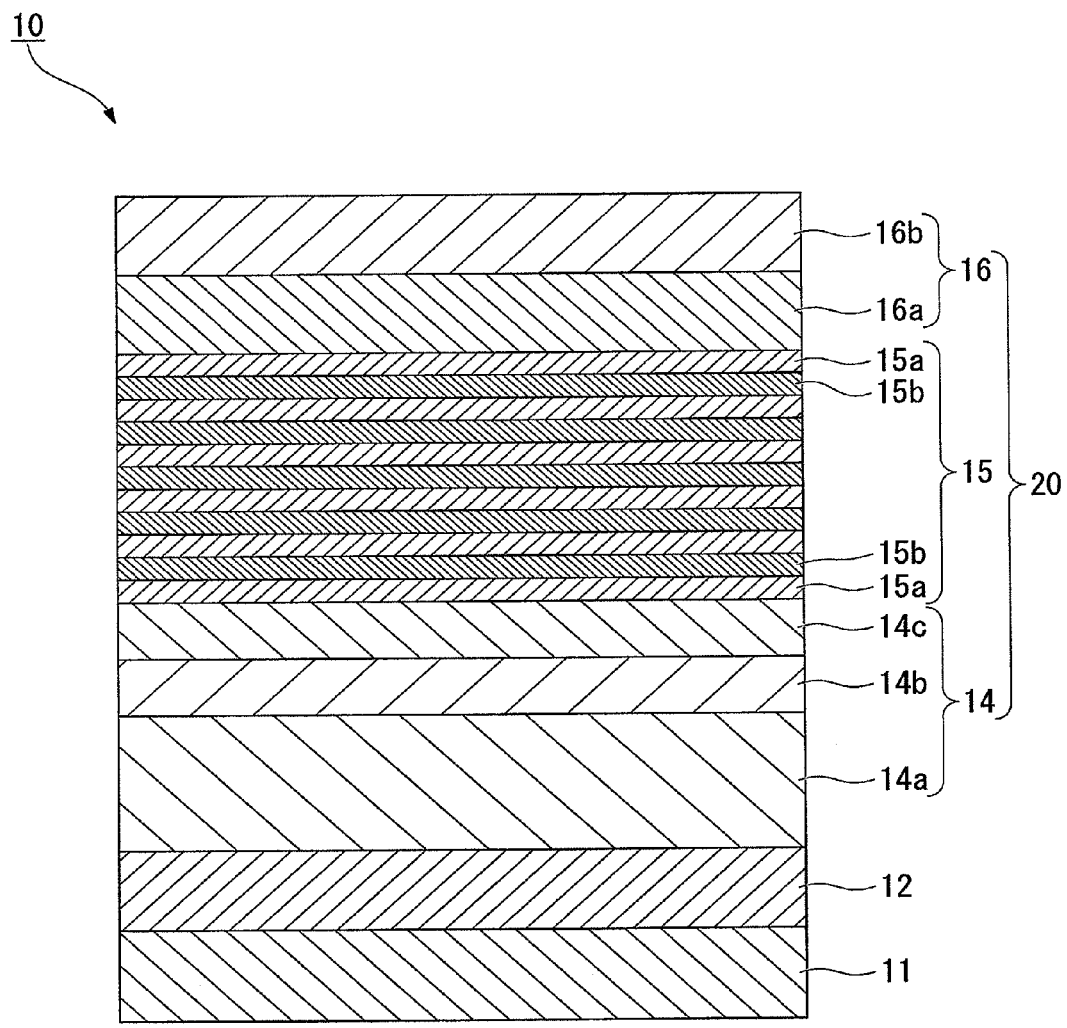
FIG. 4 is a diagram for explaining the method for manufacturing a Group III nitride semiconductor light-emitting device shown in FIG. 2, and is a cross-sectional diagram schematically showing a laminated semiconductor.

In the manufacturing method of the present embodiment, a laminated semiconductor 10 as shown in FIG. 4 is formed by forming a buffer layer 12 on the substrate 11 and forming a semiconductor layer 20 thereon. In an example shown in the present embodiment, the buffer layer 12 is formed using a sputtering method, a ground layer 14a of an n-type semiconductor layer 14 and an n-type contact layer 14b are formed thereon using a sputtering method, and then an n-type clad layer 14c is formed by a MOCVD method.

In the manufacturing method of the present embodiment, each layer of the n-type contact layer 14b and the n-type clad layer 14c is semiconductor layer is formed as a Group III nitride semiconductor layer having an n-type characteristic as a result of doping of Si.

In the manufacturing method of the present embodiment, when a Group III nitride semiconductor layer having an n-type characteristic is formed on the substrate 11 using the sputtering apparatus 40 shown in FIG. 1, by controlling the first plasma generation means 51 and the second plasma generation means 52 through control means (supply means) (not shown), a first plasma generation step of generating a first plasma, capable of sputtering a target 47 thereby supplying material particle onto a substrate 11, and a second plasma generation step of generating a second plasma containing a nitrogen element are alternately performed to alternately form a first plasma and a second plasma in the chamber 41.

The manufacturing method of the present embodiment includes, between a first plasma generation step and a second plasma generation step, a first to second gas replacement step of replacing the atmosphere in the chamber 41 by a gas for formation of a plasma atmosphere for the second plasma generation step, and also includes, between a second plasma generation step and a first plasma generation step, a second to first gas replacement step of replacing the atmosphere in the chamber 41 by a gas for formation of a plasma atmosphere for the first plasma generation step.
(Pretreatment Step)

In the present embodiment, before performing the first plasma generation step, a pretreatment step of replacing the atmosphere in the chamber 41 by an atmosphere of a gas for formation of a first plasma, which contains no nitrogen element atmosphere, for the first plasma generation step. The pretreatment step is performed by supplying an argon gas into the chamber 41 using argon gas supply means 42b.

In the present embodiment, it is possible to use, as a gas for formation of a plasma, an inert gas, a nitrogen atom-containing gas, or a mixed gas thereof. In a first plasma generation step described below, a gas for formation of a first plasma, which contains no nitrogen element, is used. In a second plasma generation step, a gas for formation of a second plasma, containing a nitrogen element is used.
(First plasma Generation Step)

After the pretreatment step, by replacing the atmosphere in the chamber 41 by an argon atmosphere under a predetermined pressure using the argon gas supply means 42b and pressure control means 49, and applying a predetermined power from the power supply 48b to the target 47, a first plasma capable of supplying material particles onto the substrate 11 is generated (first plasma generation step). By the first plasma generation step, material particles composed of the material constituting the target 47, such as particles of a Group III element fly out from the target 47 into a vapor phase in the chamber 41. The material particles are supplies and accumulated so as to conflict with the surface of the substrate 11. As a result, a thin film composed of the material constituting the target 47 is formed on the substrate 11.

In the first plasma generation step, it is possible to use, as the gas for formation of a first plasma, which contains no nitrogen element, an inert gas having a large weight and low reactivity, like argon (Ar) as described above.

The pressure in the chamber 41 in the first plasma generation step is preferably controlled within a range from 0.1 to 10 Pa. When the pressure in the chamber 41 is less than 0.1 Pa or more than 10 Pa, stable plasma may not be obtained since discharge becomes unstable. The power to be applied to the target 47 is preferably controlled within a range from 0.1 W/cm$^2$ to 100 W/cm$^2$, and more preferably from 1 W/cm$^2$ to 50 W/cm$^2$. When the power to be applied to the target 47 is controlled to less than 0.1 W/cm$^2$, stable plasma may not be obtained since discharge becomes unstable. In contrast, when the power to be applied to the target 47 is more than 100 W/cm$^2$, energy of the sputtered material particles increases, and thus crystals are damaged.

A thin film composed of the material constituting the target 47 to be formed in the first plasma generation step preferably has a thickness of 0.2 nm to 2 nm, and more preferably a one-atomic layer thickness.
(First to Second Gas Replacement Step)

After completion of the first plasma generation step, in order to initiate the second plasma generation step, the gas in the chamber 41 is replaced by a gas for formation of a second plasma atmosphere, containing a nitrogen element, for the second plasma generation step (first to second gas replacement step). In the first to second gas replacement step, as soon as the first plasma generation step is completed, supply of the argon gas by the argon gas supply means 42b is terminated and supply of a nitrogen gas into chamber 41 by the nitrogen gas supply means 42a is initiated. As soon as the first plasma generation step is completed, application of the power to the target 47 is terminated and application of the power from the power supply 48a to the substrate 11 side is initiated.

In the present embodiment, a nitrogen gas was used as the gas for formation of a second plasma in the second plasma generation step. However, commonly known nitride materials can used in place of the nitrogen gas without any limitations. It is preferred to use, as the gas for formation of a plasma, containing a nitrogen element, ammonia or nitrogen that is easily handled, and is comparatively inexpensive and is commercially available. Ammonia is preferably since it has satisfactory decomposition efficiency and can form a film at a high grow rate. However, because of high reactivity, it is necessary to use, as the material of a member to be used in a reaction apparatus, a material having high chemical stability, resulting in high apparatus costs. Taking a balance with apparatus costs into consideration, it is most preferred to use nitrogen (N$_2$) as the gas for formation of a plasma, containing a nitrogen element.

It is preferred that the pressure in the chamber 41 and the power from the power supply 48a to the substrate 11 side in the first to second gas replacement step are adjusted within a range described below so that the plasma in the chamber 41 does not disappear.

Specifically, the pressure in the chamber 41 in the first to second gas replacement step is preferably controlled within a range from 0.1 to 10 Pa. When the pressure in the chamber 41 is less than 0.1 Pa or more than 10 Pa, stable plasma may not be obtained since discharge becomes unstable.

The power from the power supply 48a to the substrate 11 side in the first to second gas replacement step is preferably controlled within a range from 10 W to 100 W. When the power from the power supply 48a to the substrate 11 side in the first to second gas replacement step is controlled to less than 10 W, stable plasma may not be obtained since discharge becomes unstable. In contrast, when the power from the power supply 48a to the substrate 11 side in the first to second gas replacement step is more than 100 W, the Group III nitride semiconductor layer on the substrate 11 may be drastically damaged by Ar plasma, resulting in deterioration of crystallinity.

The time of the first to second gas replacement step is preferably controlled from 0.1 second to 10 seconds. When the gas replacement time is less than 0.1 second, displacement of the gas in the chamber 41 may become incomplete. In contrast, when the gas replacement time is more than 10 seconds, the Group III nitride semiconductor layer on the substrate 11 may be drastically damaged by Ar plasma, resulting in deterioration of crystallinity.

(Second Plasma Generation Step)

Thereafter, the second plasma generation step is performed by replacing the atmosphere in the chamber 41 by a nitrogen atmosphere under a predetermined pressure using the nitrogen gas supply means 42a and the pressure control means 49, and applying a predetermined power from the power supply 48a to the substrate 11 side. According to the second plasma generation step, a second plasma containing a nitrogen element is generated and supplied onto the substrate 11, and also the material that forms the target 47 constituting the thin film formed on the surface of the substrate 11 in the first plasma generation step is nitrided into a nitride.

It is possible to use, as a gas for formation of a second plasma, which contains at least a nitrogen element in the second plasma generation step, a nitrogen atom-containing gas (nitrogen: $N_2$ gas, $NH_3$ gas, etc.) as described above. Such a nitrogen atom-containing gas is converted into a plasma and decomposed into nitrogen atoms by sputtering to give a material for crystal growth.

The pressure in the chamber 41 in the second plasma generation step is preferably from 0.1 to 10 Pa. When the pressure in the chamber 41 is less than 0.1 Pa or more than 10 Pa, stable plasma may not be obtained since discharge becomes unstable.

The power from the power supply 48a to the substrate 11 side in the second plasma generation step is preferably controlled within a range from 10 W to 10 kW, and more preferably from 50 W to 5 kW. When the power from the power supply 48a to the substrate 11 side in the second plasma generation step is controlled to less than 10 W, stable plasma may not be obtained since discharge becomes unstable. In contrast, when the power from the power supply 48a to the substrate 11 side in the second plasma generation step is more than 10 kW, energy of the plasma increased and causes sputtering of the substrate or sputtering in the chamber 41.

(Second to First Gas Replacement Step)

When the second plasma generation step is completed, in order to initiate the first plasma generation step again, the gas in the chamber 41 is replaced by an atmosphere of a gas for formation of a first plasma, which contains no nitrogen element, for the first plasma generation step (second to first gas replacement step). In the second to first gas replacement step, as soon as the second plasma generation step is completed, supply of a nitrogen gas into the chamber 41 by the nitrogen gas supply means 42a is terminated and supply of an argon gas by the argon gas supply means 42b is initiated. In the second to first gas replacement step, application of the power from the power supply 48a to the substrate 11 side is not terminated, but is continued at a predetermined power.

It is preferred that the pressure in the chamber 41 and the power from the power supply 48a to the substrate 11 side in the second to first gas replacement step are adjusted within a range described below so that the plasma in the chamber 41 does not disappear.

Specifically, the pressure in the chamber 41 in the second to first gas replacement step is preferably controlled within a range from 0.1 to 10 Pa. When the pressure in the chamber 41 is less than 0.1 Pa or more than 10 Pa, stable plasma may not be obtained since discharge becomes unstable.

The power from the power supply 48a to the substrate 11 side in the second to first gas replacement step is preferably controlled within a range from 10 W to 100 W. When the power from the power supply 48a to the substrate 11 side in the second to first gas replacement step is controlled to less than 10 W, stable plasma may not be obtained since discharge becomes unstable. In contrast, when the power from the power supply 48a to the substrate 11 side in the second to first gas replacement step is more than 100 W, the Group III nitride semiconductor layer on the substrate 11 may be drastically damaged by Ar plasma, resulting in deterioration of crystallinity.

The time of the second to first gas replacement step is preferably controlled from 0.1 second to 10 seconds. When the gas replacement time is less than 0.1 second, displacement of the gas in the chamber 41 may become incomplete. In contrast, when the gas replacement time is more than 10 seconds, the Group III nitride semiconductor layer on the substrate 11 may be drastically damaged by Ar plasma, resulting in deterioration of crystallinity.

After completion of the second to first gas replacement step, the atmosphere in the chamber 41 is replaced by an argon atmosphere under a predetermined pressure using the argon gas supply means 42b and the pressure control means 49, application of the power from the power supply 48a to the substrate 11 side is terminated, and then application of a predetermined power from the power supply 48b to the target 47 is initiated. Whereby, a first plasma containing a Group III element is generated in the same manner as described above (first plasma generation step).

As described above, in the present embodiment, starting from a pretreatment step, the respective steps from a first plasma generation step to a second to first gas replacement step are repeated predetermined times in the sequence of the first plasma generation step, the first to second gas replacement step, the second plasma generation step and the second to first gas replacement step. Finally, the step is performed up to the second plasma generation step without performing the second to first gas replacement step, and thus formation of a Group III nitride semiconductor layer having a predetermined thickness onto the substrate 11 is completed.

A film formation rate of the Group III nitride semiconductor layer to be formed by performing the first plasma generation step and the second plasma generation step is preferably controlled within a range from 5 nm/min to 300 nm/min. When the film formation rate is less than 5 nm/min, an influence of the reaction between a Group III metal and oxygen remaining in the chamber 41 increases, resulting in deterioration of crystallinity of a Group III nitride semiconductor. In contrast, when the film formation rate is more than 300 nm/min, the time of migration of the Group III metal sputtered onto the substrate 11 becomes insufficient, resulting in deterioration of crystallinity.

In the present embodiment, a Si hydride is introduced into at least either or both of the first plasma generation step and the second plasma generation step. More preferably, the Si hydride is introduced into the chamber 41 during the first plasma generation step. The target 47 containing a Ga element is exposed to a plasma of an argon gas and particles of Ga flies out from the target 47 and, at the same time, the Si hydride is supplied into the chamber 41. Then, the Si hydride is decomposed by the plasma described above to produce a Si element, and a GaN layer in which Si has been added is formed on the substrate 11 by supplying these particles so as to conflict with the substrate 11 attached to the heater 44, or the surface of a film laminated on the substrate 11. As a result of nitridation by the subsequent second plasma, a GaN layer in which Si has been added is formed.

Herein, the amount of the Si hydride to be supplied into the chamber 41 is varied by operating flow control means 54, thereby making it possible to control a ratio of a Ga element and a Si element in an atmosphere gas in the chamber 41. In this case, it becomes possible to control the concentration of Si in GaN (semiconductor layer) crystals to be formed to an optimum value by appropriately adjusting the amount of the Si element to be supplied into the chamber 41.

In the present embodiment, it is possible to form a layer composed of a Group III nitride semiconductor having n-type conductivity controlled by adding Si by using a Si hydride as a material of Si that is a dopant.

Although silane ($SiH_4$) is preferably used as the Si hydride, disilane ($Si_2H_6$) can also be used.

In the method for manufacturing a Group III nitride semiconductor layer of the present embodiment, a Si hydride is decomposed in a plasma by using the Si hydride as a material of Si that is a dopant. Therefore, it is possible to efficiently form an n-type Group III nitride semiconductor layer, in which Si is less likely to be converted into the form of a multimer and Si has a high activation rate of Si, by a reactive sputtering method.

In the method for manufacturing a Group III nitride semiconductor layer of the present embodiment, in the first plasma generation step, a Si hydride is supplied into the chamber 41 at the timing when an Ar plasma is formed in the chamber 41. Therefore, it is possible to form an n-type Group III nitride semiconductor layer having improved Si doping efficiency, high Si activation rate and excellent crystallinity.

In the present embodiment, not only a so-called alternate discharge sputtering method including the first sputtering step and second sputtering step described above, but also a conventional reactive sputtering method can be used. The method for manufacturing a Group III nitride semiconductor layer using a reactive sputtering method will be described.

<Manufacturing Method (2)>

When a semiconductor layer is formed on a substrate 11 using the sputtering apparatus 40 described above, first, an argon gas and a nitrogen gas are supplied in a chamber 41, a heater 44 is allowed to generate heat by heating means (not shown) provided in the heater 44, and then the substrate 11 is warmed to a predetermined temperature, namely, a growing temperature of each layer to be grown on the substrate 11.

In a state where the substrate 11 is warmed, a power is applied to a target 47 and a current is supplied to the heater 44, and then a bias is applied to the substrate 11. At the same time, a Si hydride is supplied into the chamber 41 from Si hydride supply means 53. In this case, the amount of the Si hydride to be supplied into the chamber 41 is adjusted by flow control means 54.

By such an operation, a target 47 containing a Ga element is exposed to a plasma of an argon gas and a nitrogen gas and particles of Ga fly out from the target 47. At the same time, the Si hydride is supplied into the chamber 41 from the Si hydride supply means 53 and then decomposed into Si atoms. Then, the above respective particles are supplied so as to conflict with the substrate 11 attached to the heater 44, or the surface of a film laminated on the substrate 11 to form a layer comprised of GaN (Group III nitride semiconductor), in which Si has been added, on the substrate 11.

Herein, in the manufacturing method of the present embodiment, the amount of the Si hydride to be supplied into the chamber 41 is varied by operating flow control means 54, thereby making it possible to control a ratio of a Ga element and a dopant element in an atmosphere gas in the chamber 41. In this case, the amount of particles of the Ga element and the Si element as a dopant element in an atmosphere gas in the chamber 41 agrees with the ratio of the Ga element and the dopant element in GaN crystals to be formed. Therefore, it becomes possible to control the doping concentration of Si in GaN (semiconductor layer) crystals to be formed to an optimum value by appropriately adjusting the amount of the Si element to be supplied into the chamber 41.

The respective film formation conditions by a sputtering method will be described in detail below.

(Si Hydride)

Although silane ($SiH_4$) is preferably used as the Si hydride, disilane ($Si_2H_6$) can also be used.

According to the manufacturing method of the present embodiment, as described above, it is possible to form at least part of an n-type semiconductor layer 14 in a laminated semiconductor 10 as shown in FIG. 4 from an n-type GaN single crystal having controlled n-type conductivity by using a Si hydride as a material of Si that is a dopant.

(Gas for Formation of Plasma)

Examples of other parameters, that become important when Group III nitride semiconductor layer is formed using a reactive sputtering method, include a partial pressure of a nitrogen atom-containing gas, a film formation rate, a substrate temperature, a bias and a power.

First, an atmosphere containing a nitrogen atom-containing gas ($N_2$ gas, $NH_3$ gas, etc.) is employed as a gas atmosphere in a chamber 41 of a sputtering apparatus 40. Such a nitrogen atom-containing gas is converted into a plasma and decomposed into nitrogen atoms by sputtering to give a material for crystal growth. In order to efficiently sputter a target 47, an atmosphere containing an inert gas such as argon (Ar) having a large weight and low reactivity is employed.

The proportion of the nitrogen atom-containing gas in a gas atmosphere in the chamber 41, for example, a ratio of a flow rate of a nitrogen gas can be controlled within a range from 20% to 98% based on the total flow rate of a nitrogen gas ($N_2$) and argon (Ar). When the flow rate ratio of the nitrogen gas is less than 20%, a sputtering material may be deposited in the form of metal. In contrast, when the flow rate ratio of the nitrogen gas is more than 98%, the amount of argon becomes overly small and the sputtering rate is reduced.

In order to laminate a Group III nitride semiconductor layer having particularly satisfactory crystallinity, it is necessary that the proportion of the nitrogen atom-containing gas in the atmosphere in the chamber 41 is controlled within a range from 20 to 80% and balance is a gas containing an inert gas. The gas containing an inert gas may contain, in addition to an inert gas such as Ar, a hydrogen gas ($H_2$).

(Film Formation Rate)

The film formation rate of a Group III nitride semiconductor layer using a sputtering method is preferably controlled within a range from 0.01 to 10 nm/second. When the film formation rate is more than 10 nm/second, the laminate Group III nitride semiconductor does not become a crystal but becomes amorphous. In contrast, when the film formation rate is less than 0.01 nm/second, the process requires a wasteful long time and it becomes difficult to employ for industrial manufacturing.

(Substrate Temperature)

As a result of an intensive study, the present inventors have found that it is commonly preferred to control a substrate temperature within a range from 600 to 1,200° C. so as to form a Group III nitride semiconductor layer having satisfactory crystallinity by a sputtering method. When the substrate temperature is lower than 600° C., migration of reactive species on the substrate surface is suppressed and it becomes difficult to form a Group III nitride semiconductor having satisfactory crystallinity. In contrast, when the substrate temperature is higher than 1200° C., the Group III nitride semiconductor thus formed may be decomposed again.

In order to easily control electric resistance of the semiconductor layer by adding Si as a dopant, it is necessary that the substrate temperature is controlled within a range from 600° C. to 1,050° C. It is possible to grow a Group III nitride semiconductor layer having small density of defects such as point defect and crystallinity satisfactory by controlling the substrate temperature within a range from 600° C. to 1,050° C. Whereby, it becomes possible to easily control electric resistance by adding Si to the Group III nitride semiconductor layer.

(Bias and Power)

In order to cause migration of reaction species on the surface of the substrate 11 during crystal growth to become active, a bias to be applied to the substrate 11 side and a powder to be applied to the target 47 side are preferably set to larger values. For example, the bias to be applied to the substrate 11 upon film formation is preferably 1.5 W/cm$^2$ or more, and powder to be applied to the target 47 upon film formation is preferably within a range from 1.5 W/cm$^2$ to 5 kW/cm$^2$.

(Composition of Target)

The composition of the Group III nitride semiconductor layer can be controlled by adjusting the composition of a Group III metal to be used as a target to a desired value. For example, when a layer composed of GaN is formed, metallic Ga may be used as the target. When an AlGaN layer is formed, an AlGa alloy may be used as the target. When InGaN is formed, an InGa alloy may be used. Since the composition of the Group III nitride semiconductor varies depending on the composition of the Group III metal of the target 47, it becomes possible to form a Group III nitride semiconductor layer having a desired composition by experimentally determining the composition of the target 47.

Alternately, when an AlGaN layer is laminated, both metallic Ga and metallic Al are disposed as the target. In this case, it becomes possible to control the composition of the AlGaN layer to be laminated by varying a ratio of a surface area between metallic Ga target and metallic Al target. When an InGaN layer is laminated, it is also possible to both metallic Ga target and metallic In target, similarly.

As described above, in the method for manufacturing a Group III nitride semiconductor layer of the present embodiment, even when a conventional reactive sputtering method is used, Si is added to the Group III nitride semiconductor layer by supplying Si as a dopant in the from of a Si hydride into a chamber 41, similar to the above case of using an alternate sputtering method. Therefore, it is possible to easily control a mixing balance between a target containing a Ga element therein and Si as a dopant.

[Group III Nitride Semiconductor light-Emitting Device]

A Group III nitride semiconductor light-emitting device (hereinafter sometimes abbreviated to a light-emitting device) of the present invention, and a manufacturing method thereof will be described below.

Figure 2:
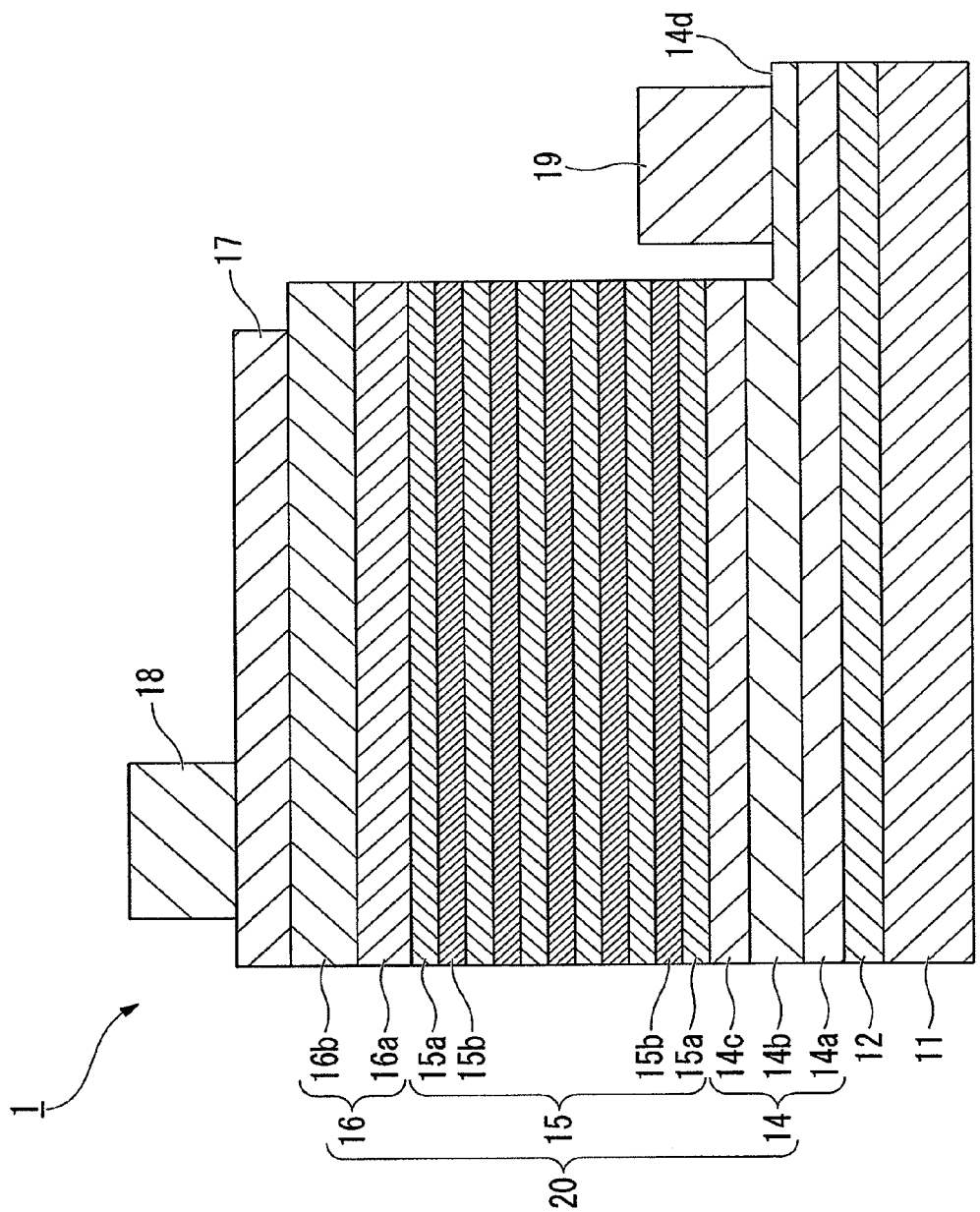
FIG. 2 is a cross-sectional diagram schematically showing an example of a Group III nitride semiconductor light-emitting device according to the present invention.
Figure 3:
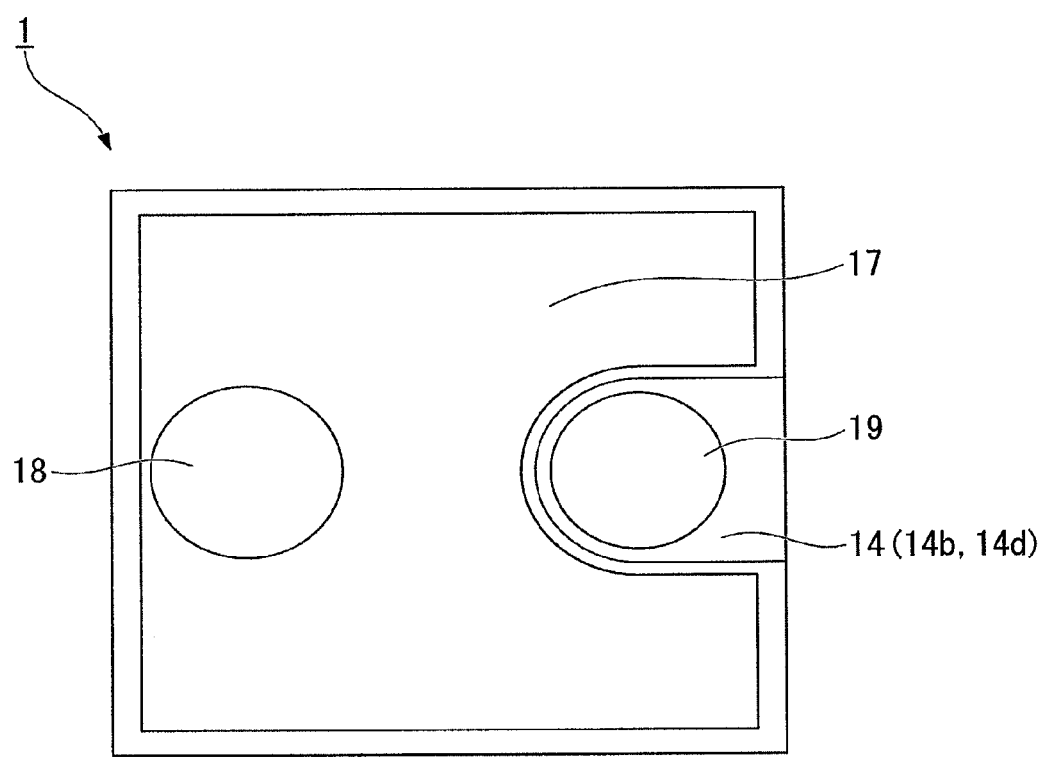
FIG. 3 is a diagram showing a planar structure of the Group III nitride semiconductor light-emitting device shown in FIG. 2.

FIG. 2 is a cross-sectional diagram schematically showing an example of a Group III nitride semiconductor light-emitting device according to the present invention. FIG. 3 is a diagram showing a planar structure of the Group III nitride semiconductor light-emitting device shown in FIG. 2.

As shown in FIG. 2, the light-emitting device 1 of the present embodiment is a one plane leered type light-emitting device, in which a buffer layer 12 and a semiconductor layer 20 composed of a Group III nitride semiconductor containing Ga as a Group III element are formed on a substrate 11. As shown in FIG. 2, the semiconductor layer 20 is a layer in which the respective layers of an n-type semiconductor layer 14, a light-emitting layer 15 and a p-type semiconductor layer 16 are laminated in this sequence.

[Laminated Structure of Light-Emitting Device]

<Substrate>

As a material which can be used for the substrate 11 in the light-emitting device 1 of the present embodiment, any substrate material on the surface of which a Group III nitride compound semiconductor crystal can epitaxially grow, can be used by selecting from various materials without particular limitations. Examples thereof include sapphire, SiC, silicon (Si), zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, and molybdenum.

<Buffer Layer>

In the light-emitting device 1 of the present embodiment, a buffer layer 12 having a hexagonal crystal structure is formed on a substrate 11.

A crystal of a Group III nitride semiconductor, that constitutes the buffer layer 12, preferably has a single crystal structure. The crystal of the Group III nitride semiconductor grows not only in an upward direction, but also in an in-plane direction to form a single crystal structure by controlling the growth conditions. Therefore, a buffer layer 12 composed of a crystal having a single crystal structure of a Group III nitride semiconductor can be formed by controlling the film formation conditions of the buffer layer 12.

When the buffer layer 12 having a single crystal structure is formed on a substrate 11, since a buffer function of the buffer layer 12 is effectively exerted, a crystal film having satisfactory orientation and crystallinity is obtained from the Group III nitride semiconductor formed thereon.

By controlling the film formation conditions, the Group III nitride compound crystals that constitute a buffer layer 12 can be formed as columnar crystals composed of a texture based on hexagonal columns (polycrystals). Herein, columnar crystals composed of a texture refer to crystals in which a crystal grain boundary is formed between adjacent crystal grains, and the crystals themselves adopt a columnar shape in a longitudinal cross-section.

Furthermore, in the buffer layer 12, an average of the width of each grain of a columnar crystal is preferably controlled within a range from 0.1 to 100 nm in view of a buffer function, and more preferably from 1 to 70 nm. Herein, the width of the grain refers to a distance between interfaces of the crystal when the buffer layer 12 is an aggregate of a columnar grain. In contrast, when grains are scattered in the form of an island, the width of the grain refers to the a crossing length of the largest portion of the plane of a crystals grain in contact with the substrate surface. In order to improve crystallinity of the crystal layer of the Group III nitride semiconductor, it is necessary to properly control the width of each crystal grain of columnar crystals. Specifically, it is preferred to control the width of each crystal grain within the above range. The crystal grain preferably has generally columnar shape, and it is desired for the buffer layer 12 that columnar grains are aggregated to form a layer.

The width of the grain of each columnar crystal can be easily measured by cross-sectional TEM observation. The width of each columnar crystal cannot be accurately defined and has some distribution of the width. Therefore, even when the width of the grain of each columnar crystal deviates from the above range in about several percentages of crystals, no influence is exerted on the effects of the present invention. It is preferred that the width of the grain of each columnar crystal is within the above range in 90% or more of crystals.

The buffer layer 12 preferably has the composition containing Al, and more preferably has the composition composed of AlN.

As the material constituting the buffer layer 12, any material can be used as long as it is a Group III nitride semiconductor represented by general formula: AlGaInN. Furthermore, the material may contain As or P as Group V. When the buffer layer 12 has the composition containing Al, it is preferred to contain GaAlN. In this case, the proportion of Al is preferably 50% or more.

The thickness of the buffer layer 12 is preferably controlled within a range from 10 to 500 nm, and more preferably from 20 to 100 nm.

When the thickness of the buffer layer 12 is less than 10 nm, the buffer function described above becomes insufficient. When the buffer layer 12 is formed in the thickness of more than 500 nm, the time of a film formation treatment may increase, resulting in deterioration of productivity regardless of no variation in function of a coat layer. The thickness of the buffer layer 12 can be easily measured by the cross-sectional TEM micrograph described above.

<Semiconductor Layer>

As shown in FIG. 2, a semiconductor layer 20 is provided with an n-type semiconductor layer 14, a light-emitting layer 15 and a p-type semiconductor layer 16.

"N-Type Semiconductor Layer"

The n-type semiconductor layer 14 is laminated on a buffer layer 12, and is composed of a ground layer 14a, an n-type contact layer 14b and an n-type clad layer 14c. In the present embodiment, as described above, the n-type semiconductor layer 14 can be formed by doping a semiconductor layer with Si by a so-called alternate discharge sputtering method including a first a sputtering step and a second a sputtering step, or a conventional reactive sputtering method. The n-type contact layer can function as a ground layer and/or an n-type clad layer.

(Ground Layer)

The ground layer 14a of the n-type semiconductor layer 14 of the present embodiment is composed of a Group III nitride semiconductor. The material of the ground layer 14a may be the same as or different from that of the buffer layer 12, but is preferably composed of a Group III nitride semiconductor containing Ga, namely, a GaN-based compound semiconductor, and more preferably composed of a $Al_xGa_{1-x}N$ layer ($0 \leq x \leq 1$, preferably $0 \leq x \leq 0.5$, and more preferably $0 \leq x \leq 0.1$).

For example, when the buffer layer 12 is composed of AlN, in order to ensure that the ground layer 14a does not simply inherit crystallinity of the buffer layer 12, migration must be used to loop the dislocation. The GaN-based compound semiconductor is likely to loop the dislocation loop, and AlGaN or GaN is particularly suitable.

The thickness of the ground layer 14a is preferably 0.1 μm or more, more preferably 0.5 μm or more, and most preferably 1 μm or more. It is easy to obtain an $Al_xGa_{1-x}N$ layer having satisfactory crystallinity by increasing the thickness to this thickness or more.

If necessary, the ground layer 14a may be doped with an n-type impurity, provided the doping quantity is within a range from $1 \times 10^{17}$ to $1 \times 10^{19}/cm^3$, but an undoped layer ($<1 \times 10^{17}/cm^3$) may also be formed, and an undoped layer is preferred in view of maintaining favorable crystallinity.

When the substrate 11 has conductivity, by doping with Si to make the ground layer 14a conductive, electrodes can be formed on the top and bottom of the light-emitting device 1 by the above so-called alternate discharge sputtering method including a first sputtering step and a second sputtering step, or a conventional reactive sputtering method. In contrast, when an insulating material is used as the substrate 11, because a chip structure must be adopted in which both the positive electrode and the negative electrode are provided on the same surface of the light-emitting device 1, forming a layer right above the substrate 11 from an undoped crystal yields superior crystallinity and is consequently preferred.

(N-Type Contact Layer)

The n-type contact layer 14b is composed of a Group III nitride semiconductor. The n-type contact layer 14b is preferably composed of an $Al_xGa_{1-x}N$ layer ($0 \leq x \leq 1$, preferably $0 \leq x \leq 0.5$, and more preferably $0 \leq x \leq 0.1$) similar to the ground layer 14a.

Furthermore, the n-type contact layer 14b is preferably doped with an n-type impurity, and incorporating the n-type impurity at a concentration of $1 \times 10^{17}$ to $1 \times 10^{19}/cm^3$, and preferably $1 \times 10^{18}$ to $1 \times 10^{19}/cm^3$ is preferred in view of maintaining a favorable ohmic contact with the negative electrode, suppressing the occurrence of cracking, and maintaining a favorable level of crystallinity. In the present embodiment, it is preferred to make the n-type contact layer 14b conductive by doping with Si using the above so-called alternate discharge sputtering method including a first sputtering step and a second sputtering step, or a conventional reactive sputtering method.

The gallium nitride-based compound semiconductors that constitute the ground layer 14a and the n-type contact layer 14b are preferably of the same composition, and the total thickness of these layers is typically set within a range from 0.1 to 20 μm, preferably from 0.5 to 15 μm, and more preferably from 1 to 12 μm. When the thickness is within this range, crystallinity of the semiconductor can be favorably maintained.

(N-Type Clad Layer)

The n-type clad layer 14c is preferably provided between the n-type contact layer 14b and the light-emitting layer 15. By providing the n-type clad layer 14c, it is possible to remedy deterioration occurring in the smoothness of the outermost surface of the n-type contact layer 14b. The n-type clad layer 14c can be composed of AlGaN, GaN or GaInN or the like. Furthermore, the n-type clad layer 14c may be either a heterojunction of these structures or a superlattice structure formed by laminating a plurality of layers. When the n-type clad layer 14c is composed of GaInN, needless to say, it is preferable that the band gap be larger than the band gap of the GaInN of the light-emitting layer 15.

The thickness of the n-type clad layer 14c is not particularly limited, however, it is preferably within a range from 5 to 500 nm, and more preferably from 5 to 100 nm.

Moreover, the n-type dopant concentration within the n-type clad layer 14c is preferably within a range from $1 \times 10^{17}$ to $1 \times 10^{20}/cm^3$, and more preferably from $1 \times 10^{18}$ to $1 \times 10^{19}/cm^3$. A dopant concentration within this range is preferred in view of maintaining favorable crystallinity and reducing the operating voltage of the light-emitting device. In the present embodiment, it is preferred to dope an n-type clad layer 14c with Si by the above so-called alternate discharge sputtering method including a first sputtering step and a second sputtering step, or a conventional reactive sputtering method.

<Light-Emitting Layer>

The light-emitting layer 15 has, as shown in FIG. 2, a structure in which barrier layers 15a composed of a gallium nitride-based compound semiconductor and well layers 15b composed of a gallium nitride-based compound semiconductor that contains indium are laminated alternately and repeatedly, and also a barrier layer 15a is positioned adjacent to both the n-type semiconductor layer 14 and the p-type semiconductor layer 16. In the example shown in FIG. 2, the light-emitting layer 15 has a structure in which six barrier layers 15a and five well layers 15b are laminated alternately and repeatedly, and also a barrier layer 15a is positioned on the top layer and the bottom layer of the light-emitting layer 15, and a well layer 15b is positioned between the respective barrier layers 15a.

As the barrier layer 15a, for example, a gallium nitride-based compound semiconductor such as $Al_cGa_{1-c}N$ ($0 \leq c \leq 0.3$) that exhibits a larger band gap energy than that of the well layer 15b composed of a gallium nitride-based compound that contains indium, may be suitably used.

Further, as the well layer 15b, for example, a gallium indium nitride such as $Ga_{1-s}In_sN$ ($0 < s < 0.4$) can be used as a gallium nitride-based compound semiconductor that contains indium.

The total thickness of the light-emitting layer 15 is not particularly limited, but is preferably the thickness that exerts a quantum effect, namely, a critical thickness. For example, the thickness of the light-emitting layer 15 is preferably within a range from 1 to 500 nm, and the more preferable film thickness is approximately 100 nm. A thickness within the above range contributes to an improvement in light emission output.

<P-Type Semiconductor Layer>

The p-type semiconductor layer 16 is composed of a p-type clad layer 16a and a p-type contact layer 16b. Further, the p-type contact layer may also function as a p-type clad layer.

(P-Type Clad Layer)

Although there are no particular limitations on the p-type clad layer 16a, provided it has a composition that exhibits a larger band gap energy than that of the light-emitting layer 15 and is capable of confining a carrier in the light-emitting layer 15, examples of preferred layers include those formed of $Al_dGa_{1-d}N$ ($0 < d \leq 0.4$, preferably $0.1 \leq d \leq 0.3$). The p-type clad layer 16a composed of this type of AlGaN is preferred in view of confining a carrier in the light-emitting layer 15.

Although there are no particular restrictions on the thickness of the p-type clad layer 16a, the thickness is preferably within a range from 1 to 400 nm, and more preferably from 5 to 100 nm.

A p-type dopant concentration of the p-type clad layer 16a is preferably within a range from $1 \times 10^{18}$ to $1 \times 10^{21}/cm^3$, and more preferably from $1 \times 10^{19}$ to $1 \times 10^{20}/cm^3$. When the p-type dopant concentration is within the above range, a satisfactory p-type crystal can be obtained without causing deterioration of crystallinity. The p-type impurity is not particularly limited and is preferably, for example, Mg.

(P-Type Contact Layer)

The p-type contact layer 16b is a gallium nitride-based compound semiconductor layer that contains at least $Al_eGa_{1-e}N$ (wherein $0 \leq e \leq 0.5$, preferably $0 \leq e \leq 0.2$, and more preferably $0 \leq e \leq 0.1$). An Al composition within the above range is preferred in view of maintaining a favorable level of crystallinity, and achieving a favorable ohmic contact with a p-ohmic electrode (refer to a translucent electrode 17 described below).

Although there are no particular limitations on the thickness of the p-type contact layer 16b, the thickness is preferably within a range from 10 to 500 nm, and more preferably from 50 to 200 nm. A film thickness in this range is preferable in view of maintaining high light emission output.

Further, a p-type dopant concentration of the p-type contact layer 16b is preferably within a range from $1 \times 10^{18}$ to $1 \times 10^{21}/cm^3$ in view of maintaining a favorable ohmic contact, preventing the occurrence of cracking, and maintaining a favorable level of crystallinity. The p-type dopant concentration is more preferably within a range from $5 \times 10^{19}$ to $5 \times 10^{20}/cm^3$. The p-type impurity is not particularly limited and is preferably, for example, Mg.

The semiconductor layer 20 constituting the light-emitting device 1 of the present invention is not limited to the embodiments described above.

For example, as for the material of the semiconductor layer, that constitutes the present invention, in addition to those described above, for example, a gallium nitride-based compound semiconductor represented by general formula: $Al_XGa_YIn_ZN_{1-A}M_A$ ($0 \leq X \leq 1$, $0 \leq Y \leq 1$, $0 \leq Z \leq 1$, and $X+Y+Z=1$, the symbol M represents a Group V element that is different from that of nitrogen (N), and $0 \leq A < 1$) is known and the known gallium nitride-based compound semiconductor can be used in the present invention without any limitations.

The Group III nitride semiconductor containing Ga as a Group III element can contain, in addition to Al, Ga and In, other Group III elements, and also can contain elements such as Ge, Si, Mg, Ca, Zn, Be, P and As, if necessary. Furthermore, there is no limitation on elements added intentionally, and the Group III nitride semiconductor may also contain impurities inevitably contained depending on film formation conditions, and a trace amount of impurities contained in materials and reaction tube materials.

<Translucent Positive Electrode>

The translucent positive electrode 17 is an electrode having translucency that is formed on the p-type semiconductor layer 16.

There are no particular limitations on the material used for the translucent positive electrode 17, and materials such as ITO ($In_2O_3$—$SnO_2$), AZO (ZnO—$Al_2O_3$), IZO ($In_2O_3$—ZnO) and GZO (ZnO—$Ga_2O_3$) can be used. Moreover, as the translucent positive electrode 17, any structure may be used without any particular limitations, including any of the conventionally known structures.

Further, the translucent positive electrode 17 may be formed so as to cover the entire surface of the p-type semiconductor layer 16, or may be formed in a lattice shape or branched shape with gaps therein.

<Positive Electrode Bonding Pad>

The positive electrode bonding pad 18 is a generally circular electrode formed on the translucent positive electrode 17 as shown in FIG. 3.

As the material for the positive electrode bonding pad 18, various structures using Au, Al, Ni and Cu are well known, and any of these known materials or structures may be used without any limitations.

The thickness of the positive electrode bonding pad 18 is preferably within a range from 100 to 1,000 nm. Further, in view of the bonding pad properties, a larger thickness yields superior bondability, and therefore the thickness of the positive electrode bonding pad 18 is more preferably controlled to 300 nm or more. Moreover, from the viewpoint of manufacturing costs, the thickness is preferably controlled to 500 nm or less.

<Negative Electrode>

The negative electrode 19 is formed so as to come in contact with the n-type contact layer 14b of the n-type semiconductor layer 14 that constitutes the semiconductor layer 20. Therefore, as shown in FIG. 2 and FIG. 3, by removing part of the light-emitting layer 15, the p-type semiconductor layer 16, and the n-type semiconductor layer 14, the exposed region 14d of the n-type contact layer 14b is formed and the negative electrode 19 is formed thereon in a generally circular form.

As the material used for the negative electrode 19, negative electrodes having various compositions and structures are widely known, and any of these negative electrodes may be used without any particular limitations.

[Method for Manufacturing Light-Emitting Device]

In order to manufacture the light-emitting device 1 shown in FIG. 2, first, a laminated semiconductor 10 including a substrate 11 and a semiconductor layer 20 formed on the substrate 11 shown in FIG. 4 is formed. In order to form the laminated semiconductor 10 shown in FIG. 4, first, a buffer layer 12, a ground layer 14a and an n-type contact layer 14b are formed on the substrate 11 by the above method for manufacturing a Group III nitride semiconductor layer using the above sputtering apparatus 40 shown in FIG. 1.

In the present embodiment, the substrate 11 is subjected to a pretreatment before a buffer layer 12 is formed on the substrate 11. A film formation process is stabilized by subjecting the substrate 11 to the pretreatment. The pretreatment of the substrate 11 may be performed, for example, by a method of disposing the substrate 11 in the chamber 41 of the sputtering apparatus 40 and sputtering before forming the buffer layer 12. Specifically, in the chamber 41, the surface of the substrate 11 can be cleaned by exposing the substrate 11 to a plasma of an Ar gas or a $N_2$ gas. For example, by treating the surface of the substrate 11 is treated with a plasma of an Ar gas, $N_2$ gas or the like, any organic material or oxides adhered to the surface of the substrate 11 can be removed. In such a case, if a voltage is applied between the substrate 11 and the chamber 41 without applying a power to the target 47, the plasma particles will act efficiently on the substrate 11.

The pretreatment of the substrate 11 is not limited to the method described above and a wet method can also be used.

After subjecting the substrate 11 to the pretreatment, a buffer layer 12, a ground layer 14a composed of an undoped semiconductor layer and an n-type contact layer 14b are sequentially formed by the above manufacturing method (1) or manufacturing method (2).

Then, an n-type clad layer 14c of an n-type semiconductor layer 14, a light-emitting layer 15 consisting of a barrier layer 15a and a well layer 15b, and a p-type clad layer 16a and a p-type contact layer 16b of a p-type semiconductor layer 16 are formed by a metal-organic chemical vapor deposition (MOCVD) method that is preferred in view of film thickness controllability.

In the MOCVD method, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source.

On the p-type contact layer 16b of the thus obtained laminated semiconductor 10 shown in FIG. 4, a translucent positive electrode 17 and a positive electrode bonding pad 18 are sequentially formed using a photolithography method.

Then, the exposed region 14d on the n-type contact layer 14b is exposed by dry etching of the laminated semiconductor 10 with the translucent positive electrode 17 and the positive electrode bonding pad 18 formed thereon.

Then, a light-emitting device 1 shown in FIG. 2 and FIG. 3 can be obtained by forming a negative electrode 19 on the exposed region 14d using a photolithography method.

In the light-emitting device of the present embodiment, since the ground layer 14a and the n-type contact layer 14b of the n-type semiconductor layer 14 among the semiconductor layer 20 are formed by the above method for manufacturing a Group III nitride semiconductor layer using the sputtering apparatus 40 shown in FIG. 1, a Group III nitride semiconductor light-emitting device including a semiconductor layer 20 having excellent crystallinity is obtained.

In the light-emitting device of the present embodiment, since the a buffer layer 12 composed of a Group III nitride semiconductor is formed between the substrate 11 and the n-type semiconductor layer 14 by the above method for manufacturing a Group III nitride semiconductor layer using the sputtering apparatus 40 shown in FIG. 1, the obtained light-emitting device includes a buffer layer 12 having excellent crystallinity. As described above, when the buffer layer 12 having excellent crystallinity is formed under the n-type semiconductor layer 14, it becomes easy to form the n-type semiconductor layer 14 having excellent crystallinity on the buffer layer 12. Therefore, the light-emitting device of the present embodiment includes the semiconductor layer 20 having extremely excellent crystallinity.

In the present embodiment, while a description was made by way of the method of forming the ground layer 14a and the n-type contact layer 14b of the n-type semiconductor layer 14 among the semiconductor layer 20 of the light-emitting device 1 by means of the above method for manufacturing a Group III nitride semiconductor layer using the sputtering apparatus 40 shown in FIG. 1 as an example, the present invention is not limited to the above example and at least part of the semiconductor layer 20 may be formed by the method for manufacturing a Group III nitride semiconductor layer of the present invention.

For example, in the present embodiment, the n-type clad layer 14c of the n-type semiconductor layer 14 and the p-type semiconductor layer 16 were formed by a MOCVD method. However, the n-type clad layer 14c and the p-type semiconductor layer 16 can also be formed by the method for manufacturing a Group III nitride semiconductor layer of the present invention.

In the light-emitting device 1 of the present invention, at least part of the semiconductor layer 20 may be formed by the method for manufacturing a Group III nitride semiconductor layer of the present invention, and film formation of the semiconductor layer 20 may be performed by using the method for manufacturing a Group III nitride semiconductor layer of the present invention in combination with any method capable of manufacturing a Group III nitride semiconductor layer, such as a conventional sputtering method, a metal-organic chemical vapor deposition method (MOCVD method), a hydride vapor phase epitaxy method (HVPE method), a molecular beam epitaxy method (MBE method) and the like.

The method for manufacturing a Group III nitride semiconductor of the present invention can be used in the above light-emitting devices; photoelectric conversion devices such as laser device and light receiving device; and electronic devices such as HBT and HEMT. Various semiconductor devices having various structures are known and the structure of the Group III nitride semiconductor light-emitting device according to the present invention is not limited, including these known device structures.

[Lamp]

The lamp of the present invention is formed with use of the light-emitting device of the present invention.

The lamp of the present invention includes, for example, a lamp in which the light-emitting device of the present invention and a phosphor are combined. By combining the light-emitting device and the phosphor, it is possible to configure a lamp using techniques known to those skilled in the art. Techniques for changing the light emission color by combining the light-emitting device and the phosphor are conventionally well known, and these types of techniques may be adopted without any particular limitations.

For example, by appropriate selection of the phosphor used in a lamp, light emission having a longer wavelength than that of the light-emitting device can be achieved. Furthermore, by mixing the emission wavelength of the light-emitting device itself and the wavelength that has been converted by the phosphor, a lamp that emits white light can be obtained.

Figure 5:
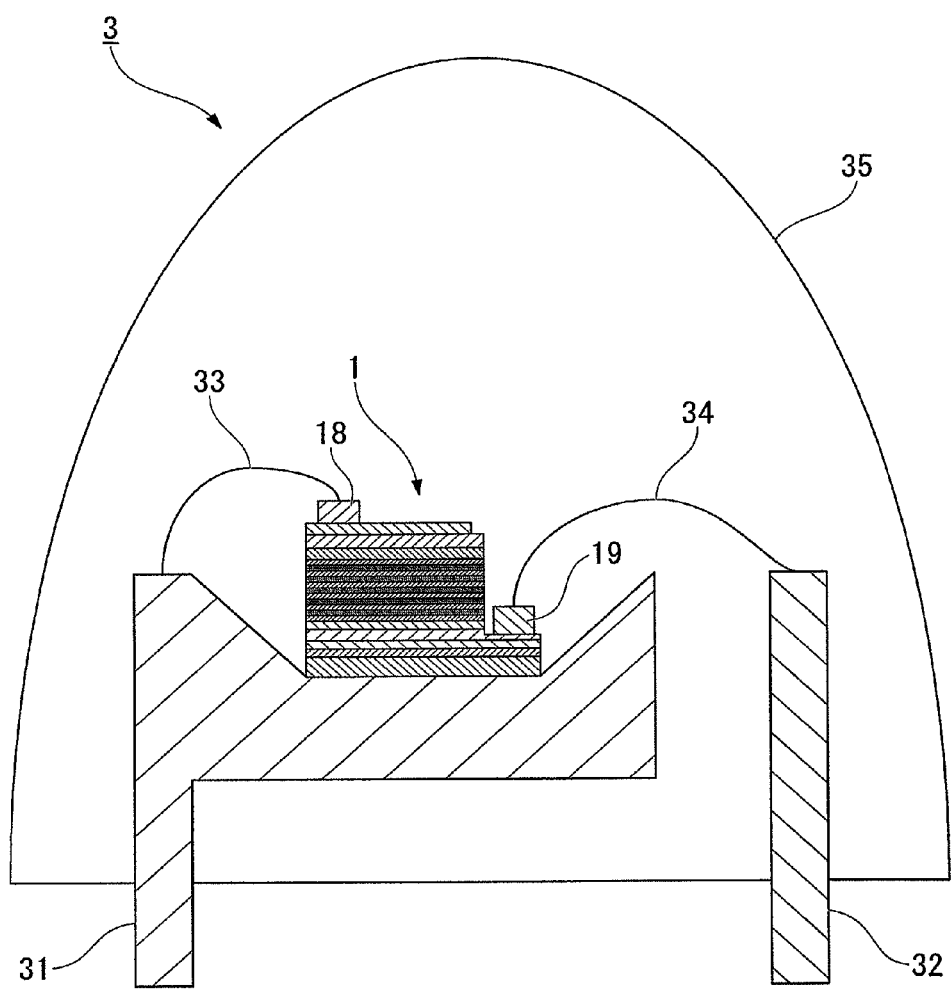
FIG. 5 is a diagram schematically showing an example of a lamp formed using the Group III nitride semiconductor light-emitting device according to the present invention.

FIG. 5 is a diagram schematically showing an example of a lamp formed by using a Group III nitride semiconductor light-emitting device according to the present invention. A lamp 3 shown in FIG. 5 is a bullet-shaped lamp and the light-emitting device 1 shown in FIG. 2 is used. As shown in FIG. 5, a positive electrode bonding pad (refer to reference symbol 18 shown in FIG. 3) of a light-emitting device 1 is bonded to one (frame 31 in FIG. 4) of two frames 31, 32 using a wire 33, and negative electrode (refer to reference symbol 19 shown in FIG. 3) of the light-emitting device 1 is bonded to the other frame 32 using a wire 34, thereby mounting the light-emitting device 1. The periphery of the light-emitting device 1 is sealed with a mold 35 composed of a transparent resin.

The lamp of the present invention is formed with use of the light-emitting device of the present invention and therefore has excellent light emission properties.

Furthermore, the lamp of the present invention can be used within all manner of applications, including bullet-shaped lamps for general applications, side view lamps for portable backlight applications, and top view lamps used in display equipment.

EXAMPLES

The present invention will be described in more detail by way of Example, but the present invention is not limited only to these Examples.
<Evaluation 1: Relation Between Flow Rate of Silane and Si Concentration>

In order to examine a relation between the flow rate of a silane gas (SiH$_4$) and the amount of Si, with which a GaN layer is doped, an n-type semiconductor layer 14 shown in FIG. 4 was formed in the following manner using a manufacturing method using a sputtering apparatus 40 shown in FIG. 1.
(Method for Manufacturing Samples of Test Examples)

First, a buffer layer 12 composed of AlN having a single crystal structure was formed on the c-plane of a substrate 11 composed of sapphire using a sputtering apparatus 40 shown in FIG. 1, and a ground layer 14a composed of an undoped GaN layer of an n-type semiconductor layer 14 and an n-type contact layer 14b composed of a Si-doped GaN layer of an n-type semiconductor layer 14 were sequentially laminated thereon.

More specifically, first, a substrate 11 composed of a 2-inch diameter (0001) c-plane sapphire that had been polished to a mirror surface was cleaned using hydrofluoric acid and an organic solvent, and then was placed inside a chamber of the sputtering apparatus. At this time, as the sputtering apparatus, there was used an apparatus that has a high frequency type power supply and that has a mechanism capable of moving the position of the magnet by rotating the magnet in the target.

The substrate 11 was heated to 500° C. in the chamber of the sputtering apparatus and a nitrogen gas was introduced at a flow rate of 15 sccm, and then a 50 W high frequency bias was applied to the substrate 11 and it was exposed to nitrogen plasma while maintaining the pressure in the chamber at 1.0 Pa, thereby cleaning the surface of the substrate 11.

Then, the temperature of the substrate 11 was maintained at 500° C., and argon and nitrogen gas were introduced into the chamber. A bias was not applied to the substrate 11 side and a high frequency power of 2,000 W was applied to the metallic Al target side. While maintaining the pressure inside the furnace at 0.5 Pa, a buffer layer 12 composed of AlN was formed on a substrate 11 composed of sapphire under the conditions where an Ar gas is allowed to flow through at a flow rate of 5 sccm and a nitrogen gas is allowed to flow through at a flow rate of 15 sccm (ratio of nitrogen gas is 75% based on the entire gas). As a result, a grow rate was 0.12 nm/s.

The magnet in the target was rotated any time, for example, during washing of the substrate 11 and film formation of the buffer layer 12. After a 50 nm thick buffer layer composed of AlN was formed, generation of the plasma was terminated. By the following procedure, a 50 nm thick buffer layer 12 composed of an AlN single crystal was formed on the substrate 11.

Then, the substrate 11 with the buffer layer 12 formed thereon was taken out from the chamber 41 of the sputtering apparatus 40 and then transported to another chamber 41 of the sputtering apparatus 40 with the same structure. As the sputtering apparatus 40 for forming a ground layer 14a of an n-type semiconductor layer 14 is formed, there was used an sputtering apparatus in which a target 47 is composed of metallic Ga and a piping for flowing through a refrigerant in the target 47 is disposed.

Before film formation of the ground layer 14a, the surface of the substrate 11 with the buffer layer 12 formed thereon was cleaned in the same manner as in the case of cleaning the substrate 11 before film formation of the buffer layer 12.

Then, the temperature of the substrate 11 was raised to 950° C. and the atmosphere inside the chamber 41 was replaced by an argon gas atmosphere (pretreatment step).
Step (1)

Then, an argon gas was introduced into the chamber 41 at a flow rate of 5 sccm and, while maintaining the pressure inside the chamber 41 at 0.5 Pa in an argon atmosphere, a first plasma containing Ga particles was generated by applying an RF power 0.5 W/cm$^2$ to a target 47 composed of Ga. Whereby, a thin film composed of Ga was formed on the substrate 11 for about 5 seconds (first plasma generation step). The Ga thin film thus obtained had a thickness of 3.4 nm.
Step (2)

Subsequently, the RF power to the target 47 was turned off and supply of the argon gas into the chamber 41 was terminated and, at the same time, supply of the nitrogen gas was initiated by turning on the RF power of 100 W to a 2-inch substrate 11 at the substrate 11 side (first to second gas replacement step). The first to second gas replacement step was performed for 1 second by controlling the pressure inside the chamber 41 to more than 0.05 Pa so that the plasma does not disappear.
Step (3)

The pressure inside the chamber 41 was controlled to 1.0 Pa and the flow rate of nitrogen was maintained at 15 sccm, and also a second plasma containing a nitrogen element was supplied on the substrate 11 at a temperature of the substrate 11 of 900° C. for 5 second while maintaining the RF power to the substrate 11 side at 100 W (second plasma generation step).

Step (4)

Then, supply of the nitrogen gas into a furnace was terminated and, at the same time, supply of an argon gas into the chamber 41 was initiated (second to first gas replacement step). The second to first gas replacement step was performed a temperature of the substrate 11 of 900° C. under a pressure of 0.2 Pa for 1 second while turning on the RF power of 20 W to the substrate 11 side so that the plasma does not disappear.

After repeating the above steps (1) to (4) 1,499 times, a 6 μm thick ground layer 14a composed of GaN was formed on the buffer layer 12 formed on the substrate 11 by performing the steps (1) to (3) at last. After film formation, the plasma operation in the chamber 41 was terminated and the temperature of the substrate 11 was decreased to room temperature. A film formation rate of a ground layer 14a thus formed by performing the first plasma generation step and the second plasma generation step was 20 nm/min.

The X-ray rocking curve (XRC) for the undoped GaN layer (ground layer 14a) thus formed was measured using an X-ray measurement apparatus (four-crystal X-ray measuring apparatus model number: X'pert, manufactured by PANalytical). The measurement was conducted using a Cuβ X-ray beam generation source as a light source, and were conducted for the symmetrical (0002) plane and the asymmetrical (10-10) plane. Generally, in the case of a Group III nitride compound semiconductor, the half maximum full-width in the XRC spectrum of the (0002) plane acts as an indicator of the crystal smoothness (mosaicity), whereas the half maximum full-width in the XRC spectrum of the (10-10) plane acts as an indicator of the dislocation density (twist).

The measurement results of the X-ray rocking curve (XRC) revealed that the ground layer 14a manufactured using the manufacturing method of Example 1 showed the half maximum full-width of 30 arcsec in the measurement of the (0002) plane and the half maximum full-width of 400 arcsec in the measurement of the (10-10) plane.

Then, the substrate 11 including layers up to the ground layer 14a was taken out from the chamber 41 of the sputtering apparatus 40, and then transported to the chamber 41 of another sputtering machine 40 having the same structure. The sputtering apparatus 40 for forming an n-type contact layer 14b used is the same as the sputtering apparatus 40 used for forming a ground layer 14a, except that it includes silane supply means 53 provided in communication in the chamber 41 and is capable of adjusting the amount of a silane gas to be supplied into the chamber 41 using flow control means 54.

In film formation of the n-type contact layer 14b, the step (1) in film formation of the ground layer 14a was replaced by the following step (1').

(1')

An argon gas was introduced into the chamber 41 at a flow rate of 5 sccm and, while maintaining the pressure inside the chamber 41 at 0.5 Pa in an argon atmosphere, a silane gas (concentration: 50 ppm) containing hydrogen ($H_2$) as a carrier gas was introduced into the chamber 41. A first plasma containing Ga particles is generated by applying an RF power of 0.5 W/cm² to a target 47 composed of Ga to form a thin film composed of Ga on the substrate 11 for about 5 seconds (first plasma generation step).

According to the flow rate of the silane gas, Test Examples 1 to 4 are as follows.

Test Example 1: 0 sccm
Test Example 2: 25 sccm
Test Example 3: 50 sccm
Test Example 4: 75 sccm With respect to Test Examples 1 to 4, after repeating steps (1') and (2) to (4) 500 times, steps (1') to (4) were performed at last. After film formation, the plasma operation in the chamber 41 was terminated and the temperature of the substrate 11 was decreased to room temperature. By performing the first plasma generation step and the second plasma generation step, an n-type contact layer 14b composed of Si-doped GaN layer was formed on a substrate 11 including layers up to the ground layer 14a was formed.

(Evaluation Results)

Figure 6:
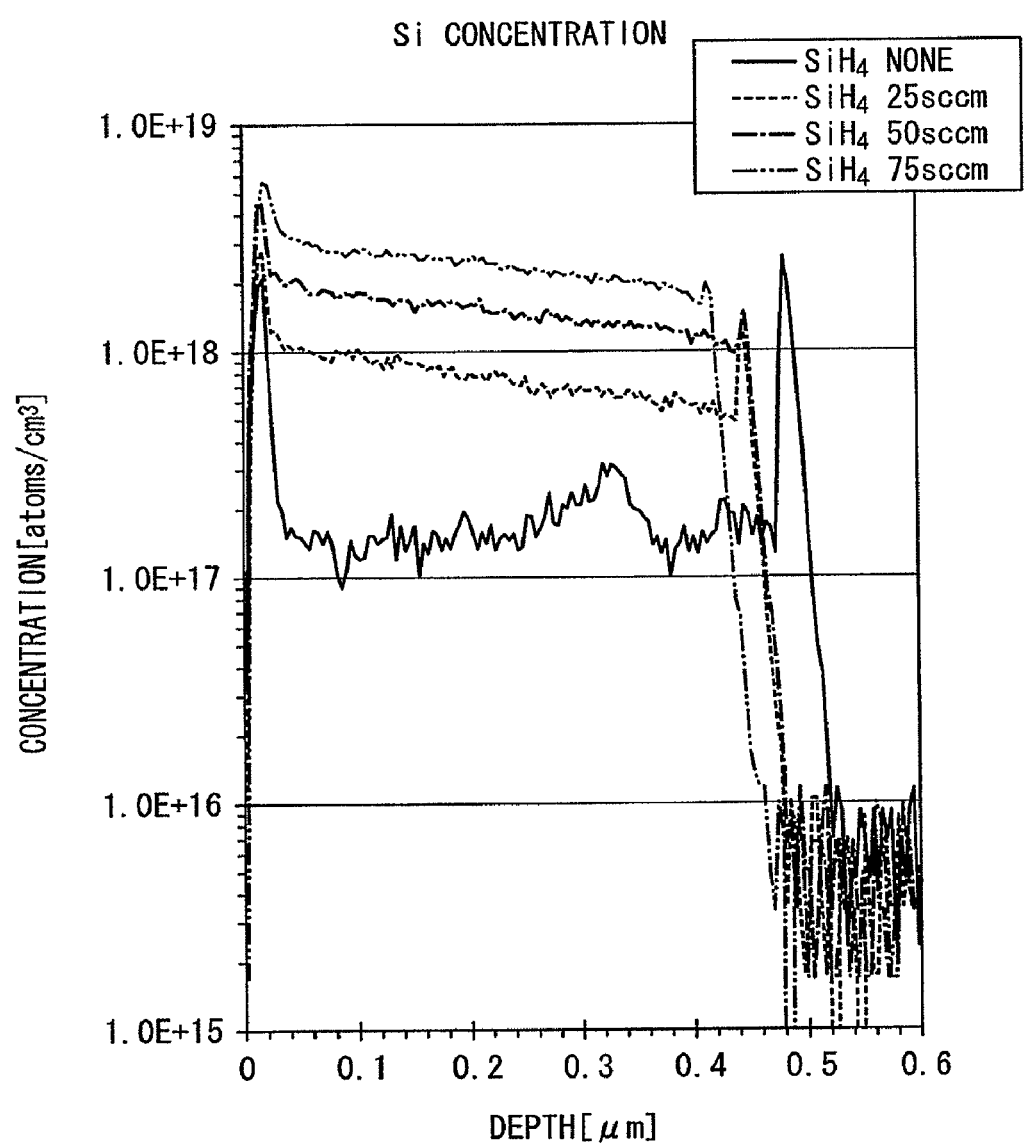
FIG. 6 is a graph showing profiles of the results of SIMS analysis of n-type contact layers 14b composed of Si-doped GaN layers of Test Examples 1 to 4.
Figure 7:
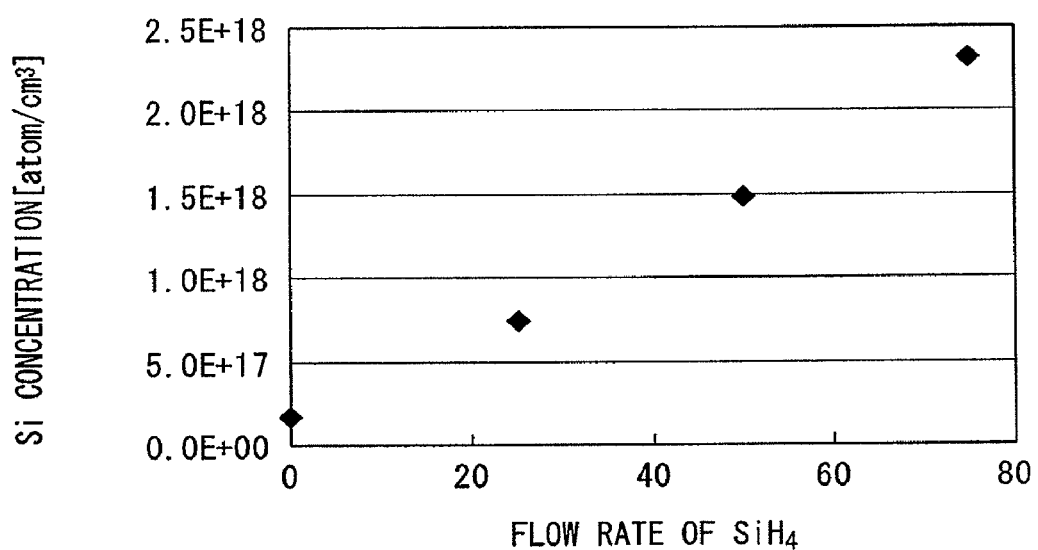
FIG. 7 is a graph showing the results of the concentration of Si added versus the silane gas flow rate obtained from SIMS analysis of Test Examples 1 to 4.

FIG. 6 is a graph showing profiles of the results of SIMS analysis of n-type contact layers 14b composed of Si-doped GaN layers of Test Examples 1 to 4. FIG. 7 is a graph showing the results of the concentration of Si added versus the silane gas flow rate obtained from SIMS analysis of Test Examples 1 to 4.

In Test Example 1, a GaN layer was formed without introducing a silane gas in the first plasma generation step of the above step (1') and, as shown in FIG. 6 and FIG. 7, it was confirmed that the GaN layer is not doped with Si.

To the contrary, in Test Examples 2, 3 and 4, a GaN layer was formed by introducing a silane gas in the first plasma generation step of the above step (1'). In Test Examples 2, 3 and 4, as shown in FIG. 6 and FIG. 7, it was confirmed that the GaN layer is doped with Si, compared with Test Example 1.

When Test Examples 2, 3 and 4 are respectively compared, as shown in FIG. 7, it was confirmed that the concentration of Si in the GaN layer increases in proportion to a flow rate of a silane gas.

From the above results, it was confirmed that the GaN layer can be doped with Si by introducing a silane gas into the first plasma generation step of generating a first plasma containing Ga particles by introducing an argon gas in the method for manufacturing a Group III nitride semiconductor layer of the present invention. It was also confirmed that since the concentration of Si, with which the GaN layer is doped, varies by varying a flow rate of a silane gas in the first plasma generation step, it is possible to control the concentration of Si, with which the GaN layer is doped, with high accuracy by a flow rate of a silane.

<Evaluation 2: Timing of Introduction of Silane Gas into Chamber>

In order to examined the doping amount by timing of introduction of a silane gas ($SiH_4$) into a chamber 41, an n-type semiconductor layer 14 shown in FIG. 4 was manufactured in the following manner using the above manufacturing method by a conventional reactive sputtering method using a sputtering apparatus 40 shown in FIG. 1.

First, a buffer layer 12 composed of AlN having a single crystal structure was formed on the c-plane of a substrate 11 composed of sapphire using a sputtering apparatus 40 shown in FIG. 1, and a ground layer 14a composed of an undoped GaN layer of an n-type semiconductor layer 14 and an n-type contact layer 14b composed of a Si-doped GaN layer of an n-type semiconductor layer 14 were sequentially laminated thereon.

(Method for Manufacturing Samples of Text Examples)

"Formation of Buffer Layer"

First, a substrate 11 composed of a 2-inch diameter (0001) c-plane sapphire that had been polished to a mirror surface was cleaned using hydrofluoric acid and an organic solvent, and then was placed inside a chamber. At this time, as the sputtering apparatus, there was used an apparatus that has a high frequency type power supply and that has a mechanism capable of moving the position of the magnet by rotating the magnet in the target.

The substrate 11 was heated to 500° C. in the chamber of the sputtering apparatus and a nitrogen gas was introduced at a flow rate of 15 sccm, and then a 50 W high frequency bias was applied to the substrate 11 and it was exposed to nitrogen plasma while maintaining the pressure in the chamber at 1.0 Pa, thereby cleaning the surface of the substrate 11.

The temperature of the substrate 11 was decreased to 500° C. after argon and nitrogen gas were introduced into the chamber. A bias was not applied to the substrate 11 side and a high frequency power of 2,000 W was applied to the metallic Al target side. While maintaining the pressure inside the furnace at 0.5 Pa, a buffer layer 12 composed of AlN was formed on a substrate 11 composed of sapphire under the conditions where an Ar gas is allowed to flow through at a flow rate of 5 sccm and a nitrogen gas is allowed to flow through at a flow rate of 15 sccm (ratio of nitrogen gas is 75% based on the entire gas). As a result, a grow rate was 0.12 nm/s.

The magnet in the target was rotated any time, for example, during washing of the substrate 11 and film formation of the buffer layer 12. After a 50 nm thick buffer layer composed of AlN was formed as described above, generation of the plasma was terminated. By the following procedure, a 50 nm thick buffer layer 12 composed of an AlN single crystal was formed on the substrate 11.

"Formation of Ground Layer"

Then, in order to grow a ground layer composed of GaN by a MOCVD method, the substrate 11 with a buffer layer 12 formed thereon was transported into the chamber of a MOCVD apparatus. In a state where a hydrogen gas is allowed to flow through the chamber, the temperature of the substrate was raised to 1,050° C. and contamination adhered to the surface of the buffer layer 12 was removed by sublimation. In this case, at the time when the temperature of the substrate 11 reached 830° C. or higher, ammonia was allowed to flow through the furnace.

After decreasing the temperature of the substrate 11 to 1,020° C., while allowing ammonia to flow thorough in the chamber, vapors of trimethyl gallium (TMG) generated by bubbling was allowed to flow through the furnace to form a 2 μm thick ground layer 14a composed of a single crystal of GaN. Then, supply of TMG was terminated and the growth of GaN was terminated, followed by cooling.

"Formation of N-Type Contact Layer"

Then, the substrate 11 with the ground layer 14a formed thereon was transported into the chamber 41 of the sputtering apparatus 40 shown in FIG. 1 and an n-type contact layer 14b composed of GaN was formed using a RF sputtering method. Herein, as the sputtering apparatus 40 for film formation of GaN, there was used an apparatus that has a high frequency type power supply and that has a mechanism capable of moving the position of the magnet within the target by sweeping of the magnet in a rectangular Ga target.

After introducing an argon gas and a nitrogen gas into the chamber 41, the temperature of the substrate 11 was raised to 1,000° C. A 2,000 W high frequency power was applied to the target 47 side composed of metallic Ga and, while maintaining the pressure in the furnace at 0.5 Pa, an n-type contact layer 14b composed of GaN was formed on a ground layer 14a under the conditions that the argon gas and the nitrogen gas are allowed to flow at a total flow rate of 50 sccm while varying a mixing ratio (Test Examples 5, 6 and 7). In this case, a GaN crystal constituting an n-type contact layer 14b was doped with Si by supplying a silane gas (concentration: 50 ppm) containing hydrogen ($H_2$) as a carrier gas into chamber 41 at flow rate of 50 sccm from silane supply means 53 provided in communication in the chamber 41.

Herein, Test Examples 5, 6 and 7 are as follows.
Test Example 5: argon gas: 50 sccm, nitrogen gas: 0 sccm
Test Example 6: argon gas: 25 sccm, nitrogen gas: 25 sccm
Test Example 7: argon gas: 0 sccm, nitrogen gas: 50 sccm
The film formation conditions of Test Example 5 and Test Example 3 described above are the same.

After film formation of an n-type contact layer 14b composed of GaN, generation of plasma was terminated. By the above procedure, an n-type contact layer 14b composed of Si-doped GaN was formed.

Through the steps as described above, a buffer layer 12 composed of AlN having a single crystal texture was formed on a substrate 11 and then a 2 μm thick undoped ground layer 14a and a Si-doped n-type contact layer 14b were formed thereon.

(Evaluation Results)

Figure 8:
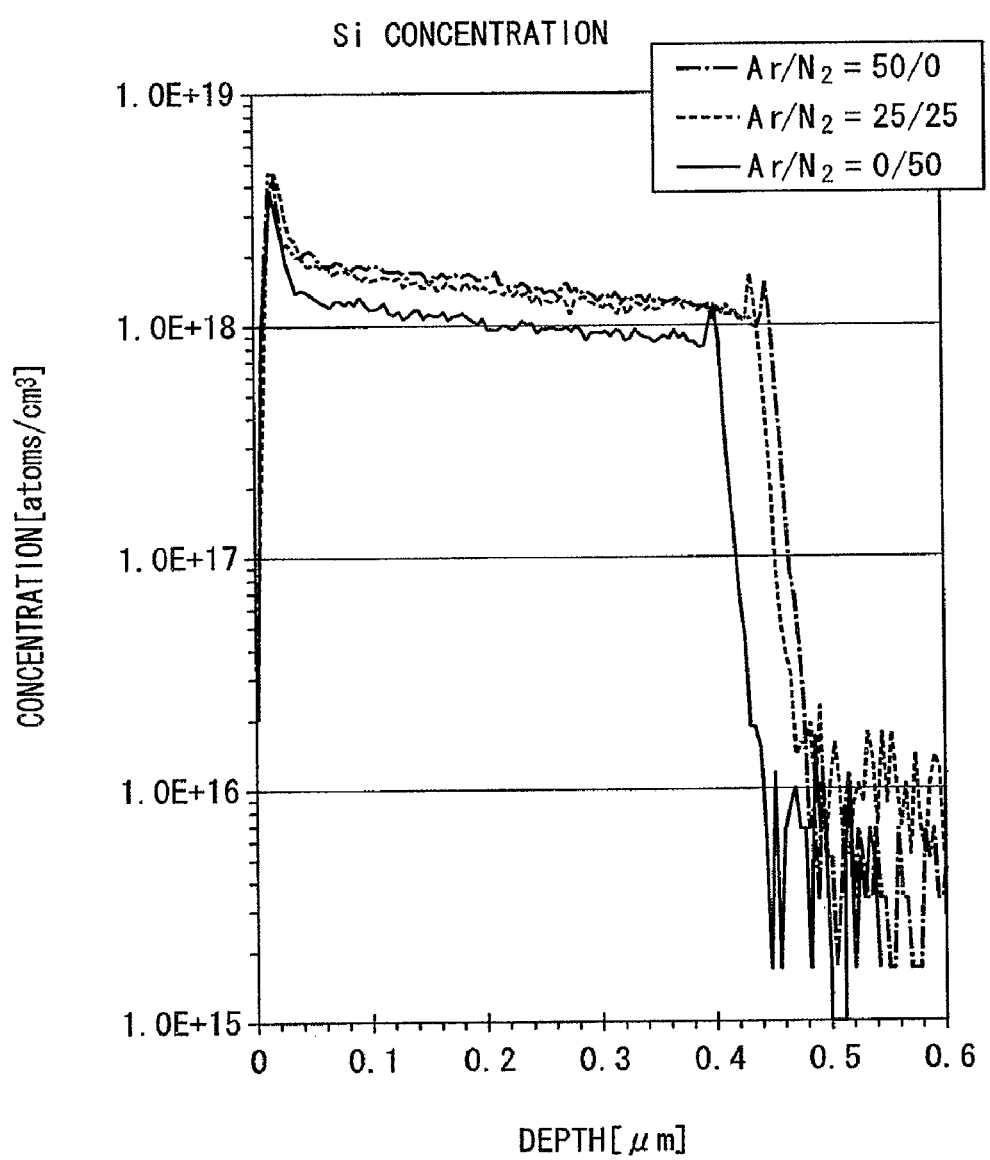
FIG. 8 is a graph showing profiles of the results of SIMS analysis of n-type contact layers 14b composed of Si-doped GaN layers of Test Examples 5, 6 and 7.
Figure 9:
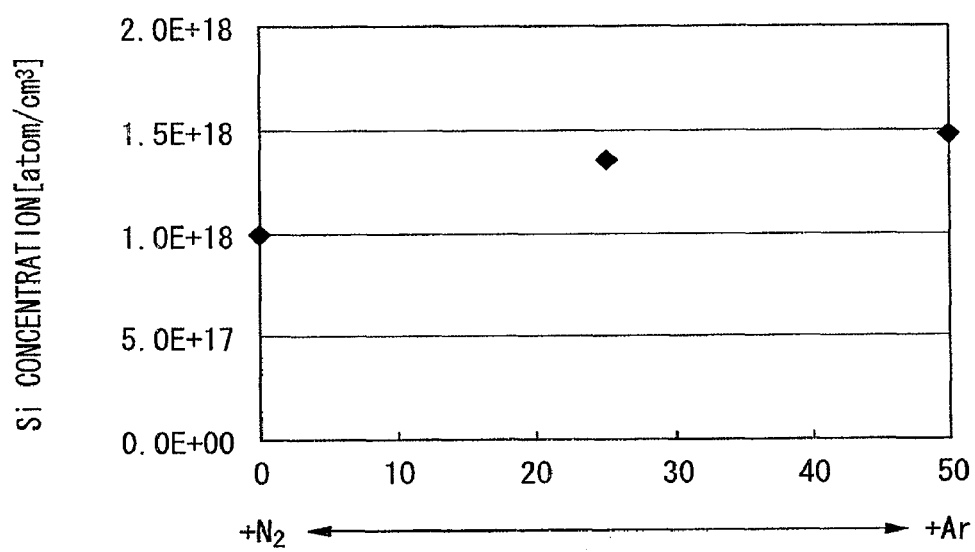
FIG. 9 is a graph showing the results of the concentration of Si added versus the mixing ratio of an argon gas and a nitrogen gas obtained from SIMS analysis of Test Examples 5, 6 and 7.

FIG. 8 is a graph showing profiles of the results of SIMS analysis of n-type contact layers 14b composed of Si-doped GaN layers of Test Examples 5, 6 and 7. FIG. 9 is a graph showing the results of the concentration of Si added versus the mixing ratio of an argon gas and a nitrogen gas obtained from SIMS analysis of Test Examples 5, 6 and 7.

In Test Example 5, as shown in FIG. 9, a silane gas was introduced at the timing when a plasma of an argon gas is generated in the chamber 41, and it was confirmed that the Si concentration in the GaN layer has the electron concentration of $1.5 \times 10^{18}$ cm$^{-3}$.

In Test Example 6, as shown in FIG. 9, a silane gas was introduced at the timing when a plasma of an argon gas and a plasma of a nitrogen gas are generated in the chamber 41, and it was confirmed that the Si concentration in the GaN layer has the electron concentration of $1.37 \times 10^{18}$ cm$^{-3}$.

In Test Example 7, as shown in FIG. 9, a silane gas was introduced at the timing when a plasma of a nitrogen gas is generated in the chamber 41, and it was confirmed that the Si concentration in the GaN layer has the electron concentration of $1.0 \times 10^{18}$ cm$^{-3}$.

From the results of FIG. 8 and FIG. 9, it was confirmed that the GaN layer is doped with Si by introducing a silane gas at any timing when only a plasma of an argon gas is regenerated, only a plasma of a nitrogen gas is regenerated, or a plasma of an argon gas and a plasma of a nitrogen gas are generated in the chamber 41.

As a result of comparison of the Si concentration of Test Examples 5, 6 and 7, it was confirmed that the Si concentration in the GaN layer increases as a composition ratio of the argon gas in the chamber 41 becomes higher.

From the above results, it was confirmed that, in the method for manufacturing a Group III nitride semiconductor layer of the present invention, the GaN layer can be doped with Si even by introducing a silane gas in any of the first plasma generation step of generating a first plasma containing Ga particles by introducing an argon gas and the second plasma generation step of generating a second plasma by introducing a nitrogen gas. It was also confirmed that it is possible to increase the concentration of Si, with which the GaN layer is doped, at the same flow rate of a silane gas by about 1.5 times by introducing the silane gas in the first plasma generation step as compared with the case of introducing the silane gas in the second plasma generation step.

INDUSTRIAL APPLICABILITY

The method for manufacturing a Group III nitride semiconductor of the present invention is capable of producing a Group III nitride semiconductor whose electric resistance has been optimally controlled by adding the dopant by a sputtering method, and thus can be employed for the production of an n-type layer of a light emitting diode (LED) and a laser diode (LD), and various semiconductor devices including electronic devices such as FETs.

The invention claimed is:

1. A method for manufacturing a Group III nitride semiconductor light-emitting device, which comprises:
a step of forming an n-type semiconductor layer by a method for manufacturing a Group III nitride semiconductor layer; and
a lamination step of sequentially laminating a laminated semiconductor layer comprising the n-type semiconductor layer, a light-emitting layer and a p-type semiconductor layer on a substrate, wherein
the method for manufacturing a Group III nitride semiconductor layer comprises:
a sputtering step of disposing a substrate and a target containing a Group III element in a chamber, introducing a gas for formation of a plasma in the chamber, and forming a Group III nitride semiconductor layer in which Si has been added as a dopant, on the substrate by a reactive sputtering method, wherein
a Si hydride is added in the gas for formation of a plasma; and
the sputtering step comprises:
a first plasma generation step of adding the Si hydride in a gas for formation of a first plasma, which contains no nitrogen element, introducing the gas in the chamber and sputtering the target, thereby generating a first plasma containing sputtering particles comprised of at least a Group III element, and
a second plasma generation step of introducing a gas for formation of a second plasma, which contains at least a nitrogen element, in the chamber and generating a second plasma containing at least the nitrogen element, wherein
the Group III nitride semiconductor layer is formed by performing the first plasma generation step and the second plasma generation step repeatedly and alternately.

* * * * *